(12) United States Patent
Xu et al.

(10) Patent No.: US 12,603,138 B2
(45) Date of Patent: *Apr. 14, 2026

(54) PARTIAL BLOCK READ VOLTAGE OFFSET

(71) Applicant: Micron Technology, Inc., Boise, ID (US)

(72) Inventors: Zhongguang Xu, San Jose, CA (US); Murong Lang, San Jose, CA (US); Zhenming Zhou, San Jose, CA (US); Ugo Russo, Boise, ID (US); Niccolo' Righetti, Boise, ID (US); Nicola Ciocchini, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 601 days.

This patent is subject to a terminal disclaimer.

(21) Appl. No.: 17/823,191

(22) Filed: Aug. 30, 2022

(65) Prior Publication Data

US 2024/0071506 A1 Feb. 29, 2024

(51) Int. Cl.
| | |
|---|---|
| *G11C 16/34* | (2006.01) |
| *G11C 16/06* | (2006.01) |
| *G11C 16/08* | (2006.01) |
| *G11C 16/26* | (2006.01) |
| *G11C 16/04* | (2006.01) |

(52) U.S. Cl.
CPC .............. *G11C 16/34* (2013.01); *G11C 16/06* (2013.01); *G11C 16/08* (2013.01); *G11C 16/26* (2013.01); *G11C 16/0483* (2013.01)

(58) Field of Classification Search
CPC ....... G11C 16/102; G11C 16/08; G11C 16/16; G11C 16/28; G11C 11/4091; G11C 11/565; G11C 2211/5634; G11C 11/5642; G11C 29/021; G11C 29/028; G11C 16/26; G11C 16/30; G11C 16/3486; G11C 16/34; G11C 16/06; G11C 11/5621; G11C 16/0483
See application file for complete search history.

(56) References Cited

U.S. PATENT DOCUMENTS

| | | | | |
|---|---|---|---|---|
| 12,013,792 | B2 * | 6/2024 | Chang ................. | G06F 12/0692 |
| 12,224,017 | B2 * | 2/2025 | Rao ........................ | G11C 16/16 |
| 12,272,408 | B2 * | 4/2025 | Rao ..................... | G11C 11/5642 |
| 2015/0170751 | A1 * | 6/2015 | Yanamanamanda ... | G11C 16/26 |
| | | | | 365/185.11 |
| 2016/0240262 | A1 * | 8/2016 | Shah ...................... | G11C 16/34 |
| 2017/0162270 | A1 * | 6/2017 | Park ..................... | G11C 29/021 |
| 2020/0357475 | A1 * | 11/2020 | Kwak ................... | G06F 3/0659 |
| 2021/0118510 | A1 * | 4/2021 | Doller ............... | G11C 16/0458 |
| 2022/0068396 | A1 * | 3/2022 | Rayaprolu ........... | G11C 16/107 |
| 2023/0368845 | A1 * | 11/2023 | Rao ...................... | G11C 11/5642 |
| 2023/0393991 | A1 * | 12/2023 | Chang ................. | G11C 29/028 |

* cited by examiner

*Primary Examiner* — Jay W. Radke
(74) *Attorney, Agent, or Firm* — Harrity & Harrity, LLP

(57) ABSTRACT

A memory device may include a memory and a controller. The controller may be configured to receive a read command associated with a block of the memory. The controller may be configured to determine a block type associated with the block. The controller may be configured to identify, based on the block type, one or more read voltage offsets for a read operation associated with the block. The controller may be configured to perform the read operation based on the one or more read voltage offsets.

28 Claims, 18 Drawing Sheets

1300

500
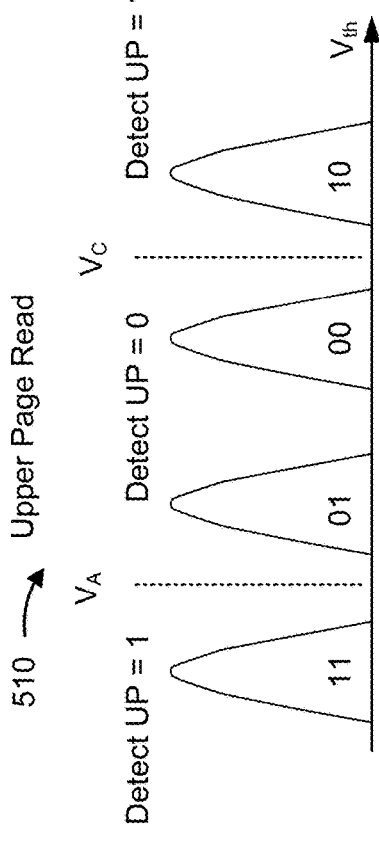
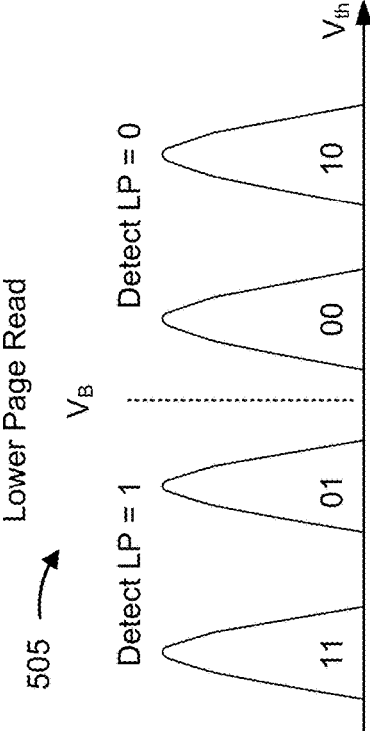
FIG. 5

Boundary Word Line Look-Up Table

| Fill % | Level 1 | Level 2 | Level 3 | Level 4 | Level 5 | Level 6 | Level m |
|---|---|---|---|---|---|---|---|
| [0%, 2%] | Offset 1-1 | Offset 1-2 | Offset 1-3 | Offset 1-4 | Offset 1-5 | Offset 1-6 | Offset 1-m |
| [2%, 10%] | Offset 2-1 | Offset 2-2 | Offset 2-3 | Offset 2-4 | Offset 2-5 | Offset 2-6 | Offset 2-m |
| [10%, 20%] | Offset 3-1 | Offset 3-2 | Offset 3-3 | Offset 3-4 | Offset 3-5 | Offset 3-6 | Offset 3-m |
| [20%, 30%] | Offset 4-1 | Offset 4-2 | Offset 4-3 | Offset 4-4 | Offset 4-5 | Offset 4-6 | Offset 4-m |
| [30%, 40%] | Offset 5-1 | Offset 5-2 | Offset 5-3 | Offset 5-4 | Offset 5-5 | Offset 5-6 | Offset 5-m |
| [40%, 50%] | Offset 6-1 | Offset 6-2 | Offset 6-3 | Offset 6-4 | Offset 6-5 | Offset 6-6 | Offset 6-m |
| [50%, 100%] | Offset n-1 | Offset n-2 | Offset n-3 | Offset n-4 | Offset n-5 | Offset n-6 | Offset n-m |

Inner Word Line Look-Up Table

| Fill % | Level 1 | Level 2 | Level 3 | Level 4 | Level 5 | Level 6 | Level m |
|---|---|---|---|---|---|---|---|
| [0%, 2%] | Offset 1-1 | Offset 1-2 | Offset 1-3 | Offset 1-4 | Offset 1-5 | Offset 1-6 | Offset 1-x |
| [2%, 10%] | Offset 2-1 | Offset 2-2 | Offset 2-3 | Offset 2-4 | Offset 2-5 | Offset 2-6 | Offset 2-x |
| [10%, 20%] | Offset 3-1 | Offset 3-2 | Offset 3-3 | Offset 3-4 | Offset 3-5 | Offset 3-6 | Offset 3-x |
| [20%, 30%] | Offset 4-1 | Offset 4-2 | Offset 4-3 | Offset 4-4 | Offset 4-5 | Offset 4-6 | Offset 4-x |
| [30%, 40%] | Offset 5-1 | Offset 5-2 | Offset 5-3 | Offset 5-4 | Offset 5-5 | Offset 5-6 | Offset 5-x |
| [40%, 50%] | Offset 6-1 | Offset 6-2 | Offset 6-3 | Offset 6-4 | Offset 6-5 | Offset 6-6 | Offset 6-x |
| [50%, 100%] | Offset y-1 | Offset y-2 | Offset y-3 | Offset y-4 | Offset y-5 | Offset y-6 | Offset y-x |

FIG. 10B

1310 — Receive a read command associated with a block of a memory

1320 — Determine a block type associated with the block

1330 — Identify, based on the block type, one or more read voltage offsets for a read operation associated with the block 1340 — Perform the read operation based on the one or more read voltage offsets

1300

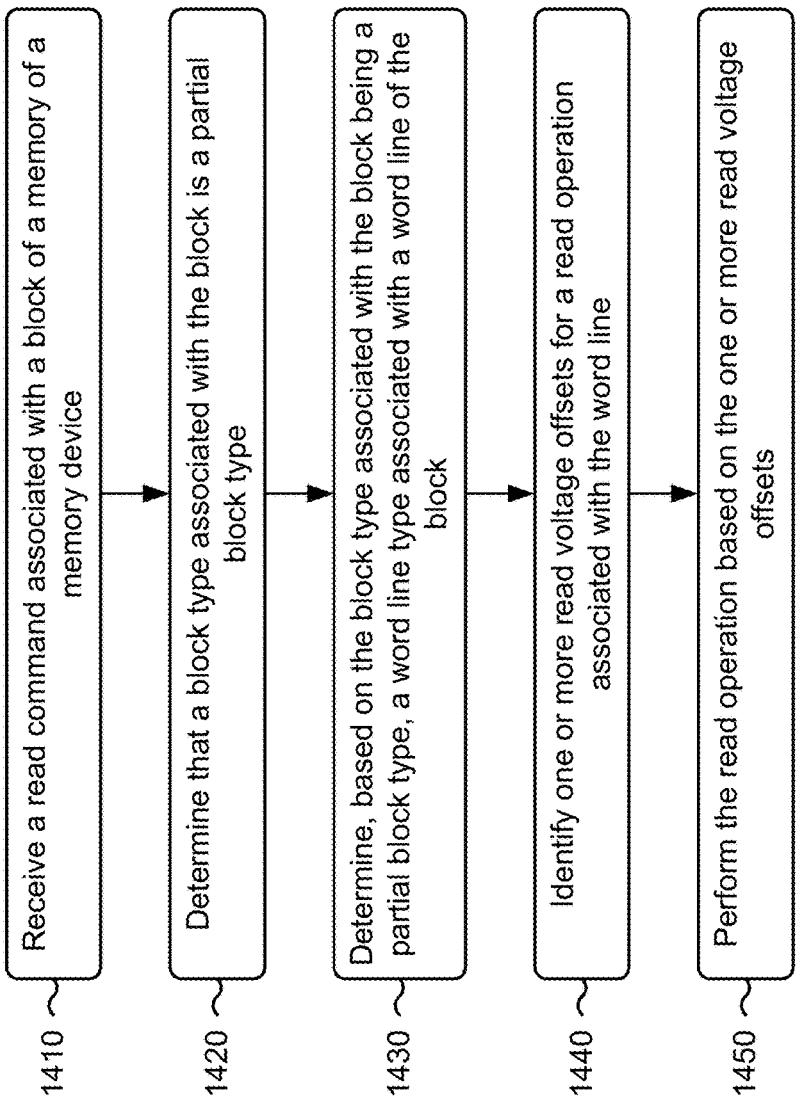

1410 Receive a read command associated with a block of a memory of a memory device 1420 Determine that a block type associated with the block is a partial block type 1430 Determine, based on the block type associated with the block being a partial block type, a word line type associated with a word line of the block 1440 Identify one or more read voltage offsets for a read operation associated with the word line 1450 Perform the read operation based on the one or more read voltage offsets

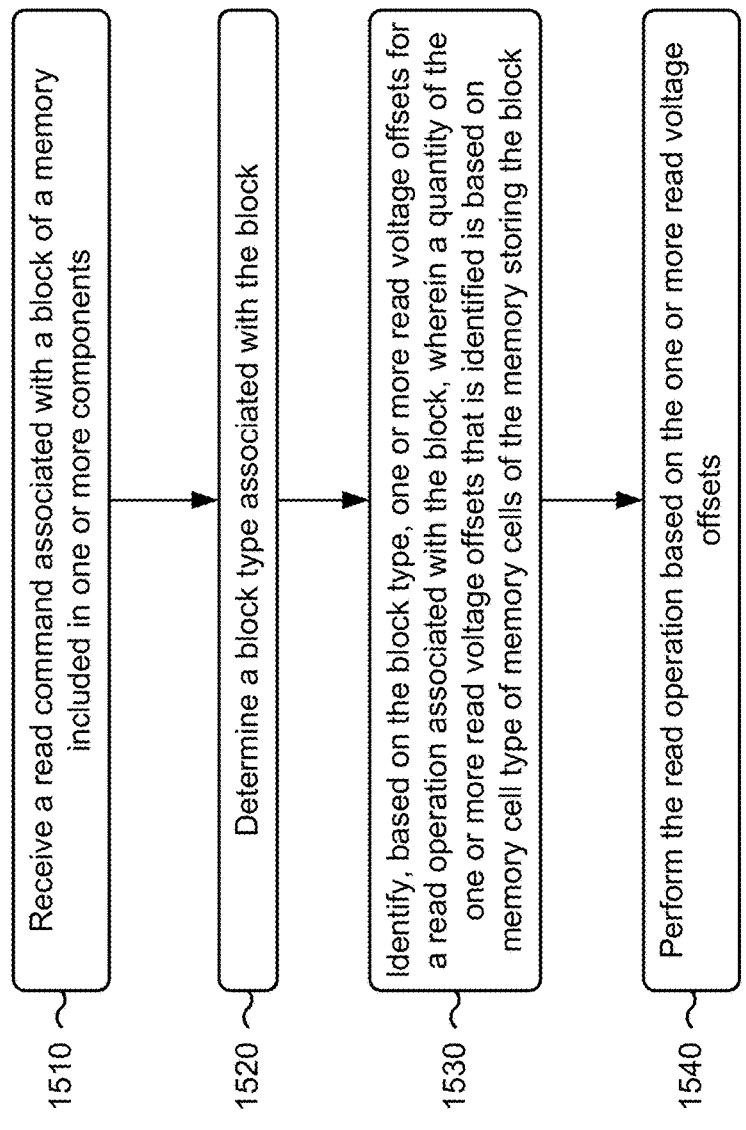

1510 — Receive a read command associated with a block of a memory included in one or more components 1520 — Determine a block type associated with the block 1530 — Identify, based on the block type, one or more read voltage offsets for a read operation associated with the block, wherein a quantity of the one or more read voltage offsets that is identified is based on memory cell type of memory cells of the memory storing the block 1540 — Perform the read operation based on the one or more read voltage offsets

Receive a read command associated with a block of a memory of a memory device

1610

Identify, based on a percentage of utilized word lines of the block, one or more read voltage offsets for a read operation associated with the word line

1620

Perform the read operation based on the one or more read voltage offsets

1630

1600

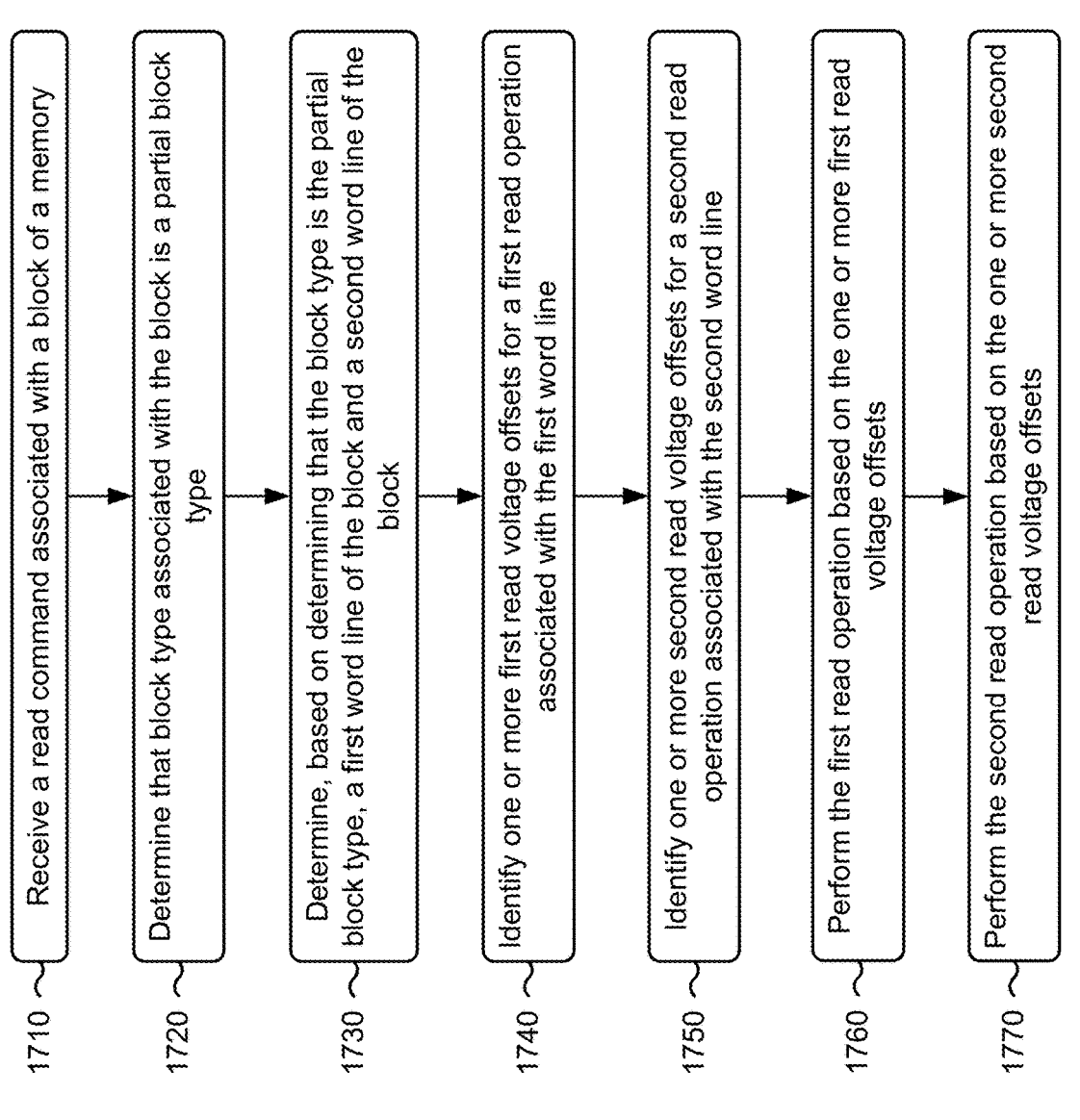

1710　Receive a read command associated with a block of a memory

1720　Determine that block type associated with the block is a partial block type 1730　Determine, based on determining that the block type is the partial block type, a first word line of the block and a second word line of the block 1740　Identify one or more first read voltage offsets for a first read operation associated with the first word line 1750　Identify one or more second read voltage offsets for a second read operation associated with the second word line 1760　Perform the first read operation based on the one or more first read voltage offsets 1770　Perform the second read operation based on the one or more second read voltage offsets

PARTIAL BLOCK READ VOLTAGE OFFSET

TECHNICAL FIELD

The present disclosure generally relates to memory devices, memory device operations, and, for example, to partial block read voltage offset.

BACKGROUND

A non-volatile memory device, such as a NAND memory device, may use circuitry to enable electrically programming, erasing, and storing of data even when a power source is not supplied. Non-volatile memory devices may be used in various types of electronic devices, such as computers, mobile phones, or automobile computing systems, among other examples.

A non-volatile memory device may include an array of memory cells, a page buffer, and a column decoder. In addition, the non-volatile memory device may include a control logic unit (e.g., a controller), a row decoder, or an address buffer, among other examples. The memory cell array may include memory cell strings connected to bit lines, which are extended in a column direction.

A memory cell, which may be referred to as a "cell" or a "data cell," of a non-volatile memory device may include a current path formed between a source and a drain on a semiconductor substrate. The memory cell may further include a floating gate and a control gate formed between insulating layers on the semiconductor substrate. A programming operation (sometimes called a write operation) of the memory cell is generally accomplished by grounding the source and the drain areas of the memory cell and the semiconductor substrate of a bulk area, and applying a high positive voltage, which may be referred to as a "program voltage," a "programming power voltage," or "VPP," to a control gate to generate Fowler-Nordheim tunneling (referred to as "F-N tunneling") between a floating gate and the semiconductor substrate. When F-N tunneling is occurring, electrons of the bulk area are accumulated on the floating gate by an electric field of VPP applied to the control gate to increase a threshold voltage of the memory cell.

An erasing operation of the memory cell is concurrently performed in units of sectors sharing the bulk area (referred to as "blocks" or "memory blocks"), by applying a high negative voltage, which may be referred to as an "erase voltage" or "$V_{era}$," to the control gate and a configured voltage to the bulk area to generate the F-N tunneling. In this case, electrons accumulated on the floating gate are discharged into the source area, so that the memory cells have an erasing threshold voltage distribution.

Each memory cell string may have a plurality of floating gate type memory cells serially connected to each other. Access lines (sometimes called "word lines") are extended in a row direction, and a control gate of each memory cell is connected to a corresponding access line. A non-volatile memory device may include a plurality of page buffers connected between the bit lines and the column decoder. The column decoder is connected between the page buffer and data lines.

BRIEF DESCRIPTION OF THE DRAWINGS

FIG. 5 is a diagram illustrating an example of read operations for a multi-level cell (MLC) non-volatile memory device.

FIGS. 10A and 10B are examples of reference voltage offset look-up tables described herein.

FIG. 14 is a flowchart of an example method associated with a partial block read voltage offset.

FIG. 15 is a flowchart of an example method associated with a partial block read voltage offset.

FIG. 17 is a flowchart of an example method associated with a partial block read voltage offset.

DETAILED DESCRIPTION

Figure 1:
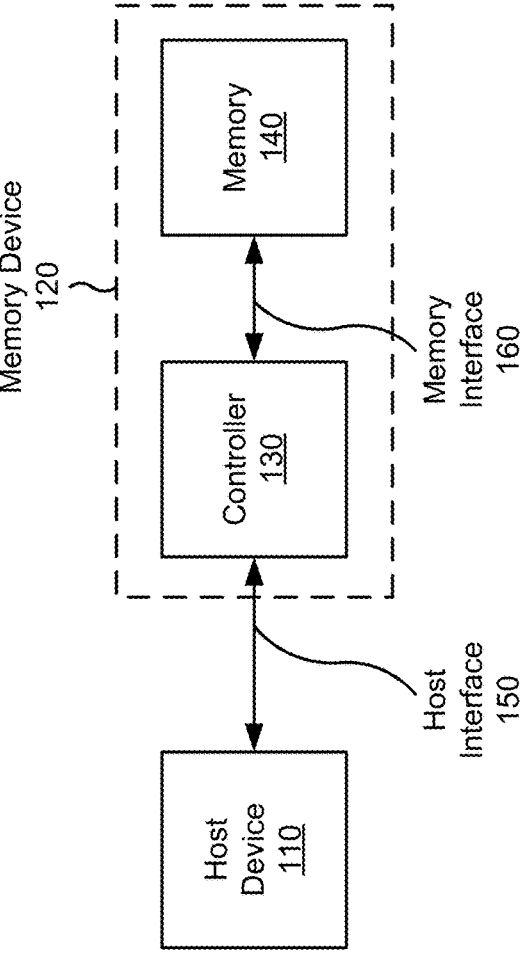
FIG. 1 is a diagram illustrating an example system configured to implement a partial block read voltage offset.

A controller of a memory device may perform a read operation to read data stored in a memory of the memory device. To read the data of a memory cell in the memory, the controller may apply a read reference voltage ($V_R$) to the cell in an effort to induce an electrical current in the memory cell. The controller may determine a corresponding bit string associated with a voltage that induced (or else did not induce) the electrical current. Put another way, the controller may apply various read reference voltages to sense the threshold voltage ($V_{th}$) associated with the data stored in the memory cell.

In some cases, the threshold voltage associated with a memory cell may shift or drift from an initial threshold voltage. This may occur, for example, in partial blocks of the memory. A "partial block," as used herein, refers to a block of a memory that is physically open but logically closed. A partial block may include a subset of word lines that are programmed and utilized, and another subset of word lines that are erased and not utilized. A partial block may remain physically open for long periods of time, and can experience threshold voltage shifting due to cell to cell pattern effects such as coupling, back patterning, and charge migration. The threshold voltage shifting may result in an increased likelihood of read errors in the memory device, an increased rate of read errors in the memory device, an increased trigger rate for the memory device, and/or an increased folding rate for the memory device, among other examples.

In some implementations described herein, a controller of a memory device may apply one or more read voltage offsets to one or more read reference voltages in a read operation to read data from a memory of the memory device. The controller may use the read voltage offset(s) to account for and/or to compensate for threshold voltage shifting in memory cells of the memory, particularly those that store partial blocks. The read voltage offset(s) may be progressive in that the magnitude(s) of the read voltage offset(s) may increase or decrease depending on the utilization of word lines in the partial block, depending on the word line types in the partial block, and/or depending on the quantity of levels in the memory cells of the memory, among other examples. The use of the read voltage offset(s) described herein may reduce the likelihood of read errors in the memory device, may reduce the rate of read errors in the memory device, may reduce the trigger rate (e.g., the rate of occurrence of implementing error recovery mechanisms) for the memory device, and/or may reduce the folding rate for the memory device (e.g., the rate of occurrence of "folding"—the moving of data from a set of blocks to another set of blocks—in the memory device to protect the data from excessive errors), among other examples. These benefits may become even more prevalent and valuable as memory devices permit increasing levels of partial blocks.

In some implementations described herein, once a block's last written page (LWP) is determined to be less than a threshold (e.g., less than a maximum page of the block), the controller may treat the block as a partial block. When the controller issues a read on the word lines of the partial block, the controller may apply one or more partial block offsets to the word lines. The controller may determine whether a word line is a boundary word line (e.g., a word line—or a set of pages or sub-blocks associated with the word line—that is adjacent to an erased or unused word line) or an inner word line (e.g., a non-boundary word line that has been written to), and may identify and apply the appropriate read voltage offset. The read voltage offset(s) may be stored in the memory device and determined based on a characterization of the memory cells of the memory. The read voltage offset(s) that are applied by the controller may be based on the LWP of the partial block. For example, the controller may identify the word line associated with the LWP as a boundary word line and may apply the appropriate boundary word line read voltage offset(s), and may identify the remaining written word lines as inner word lines and may apply the appropriate inner word line read voltage offset(s). The read voltage offset(s) described herein may be used in single-level cells (SLCs), multi-level cells (MLCs), triple-level cells (TLCs), quad-level cells (QLCs), and/or higher bit-per-cell technology.

FIG. 1 is a diagram illustrating an example system 100 configured to implement a partial block read voltage offset. The system 100 may include one or more devices, apparatuses, and/or components for performing operations described herein (e.g., for memory device wear leveling). For example, the system 100 may include a host device 110 and a memory device 120. The memory device 120 may include a controller 130 and memory 140. The host device 110 may communicate with the memory device 120 (e.g., the controller 130 of the memory device 120) via a host interface 150. The controller 130 and the memory 140 may communicate via a memory interface 160.

The system 100 may be any electronic device configured to store data in memory. For example, the system 100 may be a computer, a mobile phone, a wired or wireless communication device, a network device, a server, and/or an Internet of Things (IoT) device. The host device 110 may include one or more processors configured to execute instructions and store data in the memory 140. For example, the host device 110 may include a central processing unit (CPU), a graphics processing unit (GPU), a field-programmable gate array (FPGA), an application-specific integrated circuit (ASIC), and/or another type of processing component.

In some implementations, the host device 110 may be or may be included in a vehicle, and may be configured to display (or generate for display) an infotainment system of the vehicle, a digital dashboard of the vehicle, and/or a navigation system of the vehicle, among other examples. In some implementations, the host device 110 may be configured to provide smart or autonomous driving functionality for the vehicle, sensing functionality for the vehicle, and/or another functionality for the vehicle.

The memory device 120 may be any electronic device configured to store data in memory. In some implementations, the memory device 120 may be an electronic device configured to store data persistently in non-volatile memory. For example, the memory device 120 may be a hard drive, a solid-state drive (SSD), a flash memory device (e.g., a NAND flash memory device or a NOR flash memory device), a universal serial bus (USB) thumb drive, a memory card (e.g., a secure digital (SD) card), a secondary storage device, a non-volatile memory express (NVMe) device, and/or an embedded multimedia card (eMMC) device.

In some implementations, the memory device 120 may be configured to store host data for the host device 110. The host data may include, for example, a file system and associated data for a digital dashboard of the vehicle, a file system and associated data for an infotainment system of the vehicle, a mapping database for a navigation system of the vehicle, and/or a point of interest (POI) database for the navigation system of the vehicle, among other examples. Moreover, the memory device 120 may be configured to provide user-accessible storage for user data, which may include storage for user files, audio and/or video recordings, and/or user contact data, among other examples.

The controller 130 may be any device configured to communicate with the host device (e.g., via the host interface 150) and the memory 140 (e.g., via the memory interface 160). Additionally, or alternatively, the controller 130 may be configured to control operations of the memory device 120 and/or the memory 140. For example, the controller 130 may include a memory controller, a system controller, an ASIC, an FPGA, a processor, a microcontroller, and/or one or more processing components.

In some implementations, the memory 140 may include non-volatile memory configured to maintain stored data after the memory device 120 is powered off. For example, the memory 140 may include NAND memory or NOR memory. Additionally, or alternatively, the memory 140 may include volatile memory that requires power to maintain stored data and that loses stored data after the memory device 120 is powered off. For example, the memory 140 may include one or more latches and/or random-access memory (RAM), such as dynamic RAM (DRAM) and/or static RAM (SRAM).

The host interface 150 enables communication between the host device 110 and the memory device 120. The host interface 150 may include, for example, a Small Computer System Interface (SCSI), a Serial-Attached SCSI (SAS), a Serial Advanced Technology Attachment (SATA) interface, a Peripheral Component Interconnect Express (PCIe) interface, an NVMe interface, a USB interface, a Universal Flash Storage (UFS) interface, and/or an embedded multimedia card (eMMC) interface.

The memory interface 160 enables communication between the memory device 120 and the memory 140. The memory interface 160 may include a non-volatile memory interface (e.g., for communicating with non-volatile memory), such as a NAND interface or a NOR interface. Additionally, or alternatively, the memory interface 160 may include a volatile memory interface (e.g., for communicating with volatile memory), such as a double data rate (DDR) interface.

As indicated above, FIG. 1 is provided as an example. Other examples may differ from what is described with regard to FIG. 1.

Figure 2:
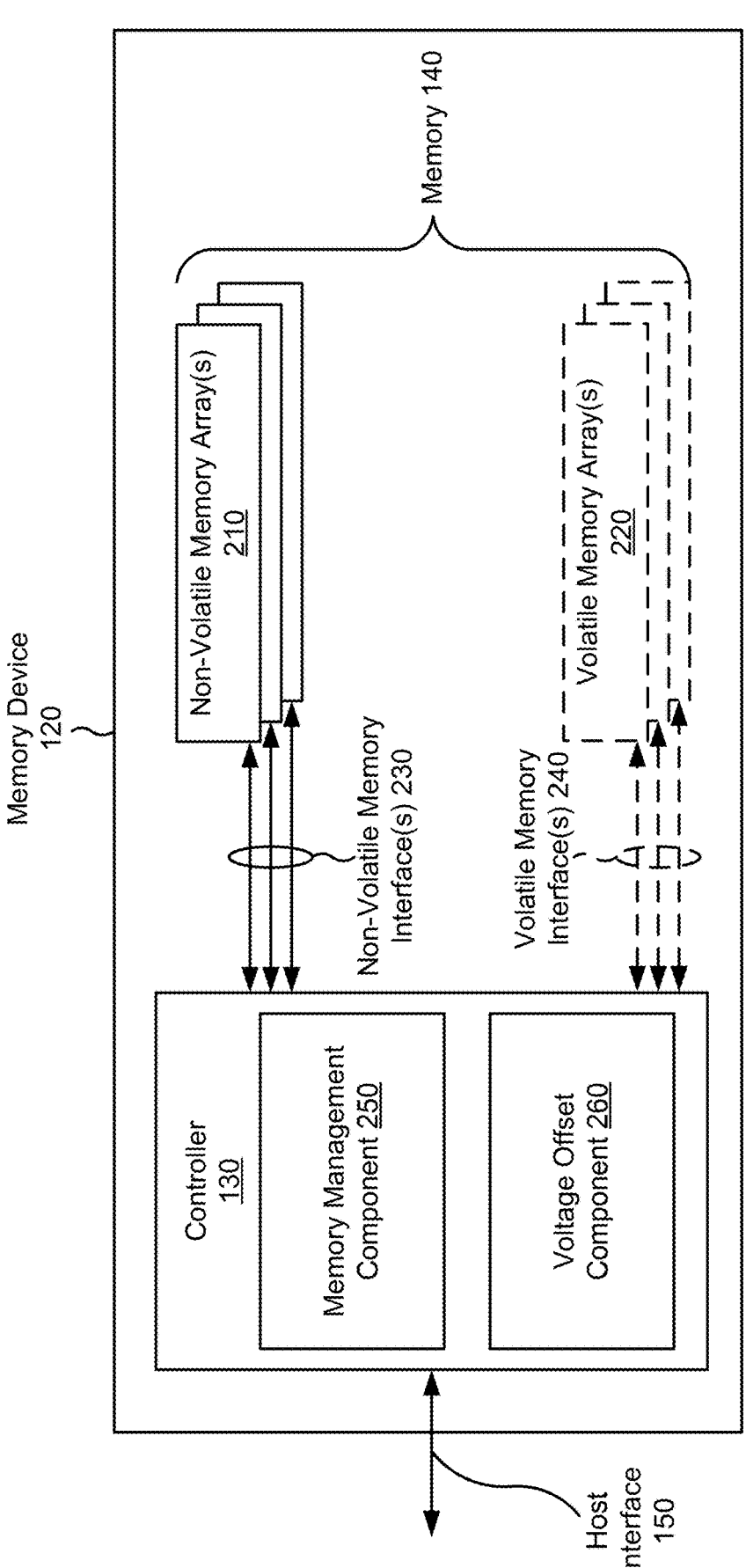
FIG. 2 is a diagram of example components included in the memory device of FIG. 1.

FIG. 2 is a diagram of example components included in the memory device 120 of FIG. 1. As described above in connection with FIG. 1, the memory device 120 may include a controller 130 and memory 140. As shown in FIG. 2, the memory 140 may include one or more non-volatile memory arrays 210. The non-volatile memory array(s) 210 may each include a plurality of physical memory cells and may be included in one or more memory arrays, such as one or more NAND memory arrays and/or one or more NOR memory arrays. The non-volatile memory array(s) 210 may include flash memory cells, EEPROM cells, and/or another type of non-volatile memory cells. Additionally, or alternatively, the memory 140 may include one or more volatile memory arrays 220, which may include one or more SRAM arrays and/or one or more DRAM arrays. The controller 130 may transmit signals to and receive signals from a non-volatile memory array 210 using a non-volatile memory interface 230. The controller 130 may transmit signals to and receive signals from a volatile memory array 220 using a volatile memory interface 240.

The volatile memory array(s) 220 may be used for functions such as caching or buffering of data that is to be written to the non-volatile memory array(s) 210, caching or buffering of data read from the non-volatile memory array(s) 210 (e.g., prior to providing the data to the host device 110), for storing and/or maintaining one or more mapping tables (e.g., logical to physical (L2P) mapping tables and/or another type of mapping tables) associated with the non-volatile memory array(s) 210, storing parity information associated with the non-volatile memory array(s) 210, and/or storing error correction code (ECC) information associated with the non-volatile memory array(s) 210, among other examples.

Alternatively, the volatile memory array(s) 220 may be omitted from the memory device 120. A memory device 120 without volatile memory array(s) 220 may be referred to as a DRAM-less memory device or a RAM-less memory device. In these types of memory devices 120, the controller 130 may use a portion of the non-volatile memory array(s) 210 for caching, buffering, and/or temporary storage. Additionally and/or alternatively, the host device 110 may allocate a portion of the volatile memory of the host device 110, which may be referred to as a host memory buffer (HMB), and the host device 110 may provide the memory device 120 with direct memory access (DMA) to the portion of the volatile memory of the host device 110 via the host interface 150. The controller 130 may access the portion of the volatile memory of the host device 110 (e.g., the HMB) and may use the portion of the volatile memory of the host device 110 for caching, buffering, and/or temporary storage, among other examples.

The controller 130 may control operations of the memory 140, such as by executing one or more instructions. For example, the memory device 120 may store one or more instructions in the memory 140 as firmware, and the controller 130 may execute those one or more instructions. Additionally, or alternatively, the controller 130 may receive one or more instructions from the host device 110 via the host interface, and may execute those one or more instructions. In some implementations, a non-transitory computer-readable medium (e.g., volatile memory and/or non-volatile memory) may store a set of instructions (e.g., one or more instructions or code) for execution by the controller 130. The controller 130 may execute the set of instructions to perform one or more operations or methods described herein. In some implementations, execution of the set of instructions, by the controller 130, causes the controller 130 and/or the memory device 120 to perform one or more operations or methods described herein. In some implementations, hardwired circuitry is used instead of or in combination with the one or more instructions to perform one or more operations or methods described herein. Additionally, or alternatively, the controller 130 and/or one or more components of the memory device 120 may be configured to perform one or more operations or methods described herein. An instruction is sometimes called a "command."

For example, the controller 130 may transmit signals to and/or receive signals from the memory 140 based on the one or more instructions, such as to transfer data to (e.g., write or program), to transfer data from (e.g., read), and/or to erase all or a portion of the memory 140 (e.g., one or more memory cells, pages, sub-blocks, blocks, or planes of the memory 140). Additionally, or alternatively, the controller 130 may be configured to control access to the memory 140 and/or to provide a translation layer between the host device 110 and the memory 140 (e.g., for mapping logical addresses to physical addresses of a memory array). In some implementations, the controller 130 may translate a host interface command (e.g., a command received from the host device 110) into a memory interface command (e.g., a command for performing an operation on a memory array).

As shown in FIG. 2, the controller 130 may include a memory management component 250. In some implementations, the controller 130 also includes a voltage offset component 260 and/or another component. In some implementations, one or more of these components are implemented as one or more instructions (e.g., firmware) executed by the controller 130. Alternatively, one or more of these components may be implemented as dedicated integrated circuits distinct from the controller 130.

The memory management component 250 may be configured to manage performance of the memory device 120. For example, the memory management component 250 may perform wear leveling, bad block management, block retirement, read disturb management, and/or other memory management operations. In some implementations, the memory device 120 may store (e.g., in memory 140) one or more memory management tables. A memory management table may store information that may be used by or updated by the memory management component 250, such as information regarding memory block age, memory block erase count, and/or error information associated with a memory partition (e.g., a memory cell, a row of memory, a block of memory, or the like).

The voltage offset component 260 may be configured to store, determine, and/or apply one or more read voltage offsets to one or more read reference voltages used by the controller 130 in one or more read operations to read data from the memory 140. The one or more read voltage offsets may be used to account for (or compensative for) shifts in the threshold voltages of the memory cells of the non-volatile memory array(s) 210 and/or of the memory cells of the volatile memory array(s) 220. The use of the one or more read voltage offsets may reduce the likelihood of and/or the rate of read errors in the memory device 120.

One or more devices or components shown in FIG. 2 may be used to carry out operations described elsewhere herein, such as one or more operations of FIGS. 8-12 and/or one or more process blocks of the methods of FIGS. 13-17. For example, the controller 130 and/or the memory management component 250 may perform one or more operations and/or methods for the memory device 120.

The number and arrangement of components shown in FIG. 2 are provided as an example. In practice, there may be additional components, fewer components, different components, or differently arranged components than those shown in FIG. 2. Furthermore, two or more components shown in FIG. 2 may be implemented within a single component, or a single component shown in FIG. 2 may be implemented as multiple, distributed components. Additionally, or alternatively, a set of components (e.g., one or more components) shown in FIG. 2 may perform one or more operations described as being performed by another set of components shown in FIG. 2.

Figure 3:
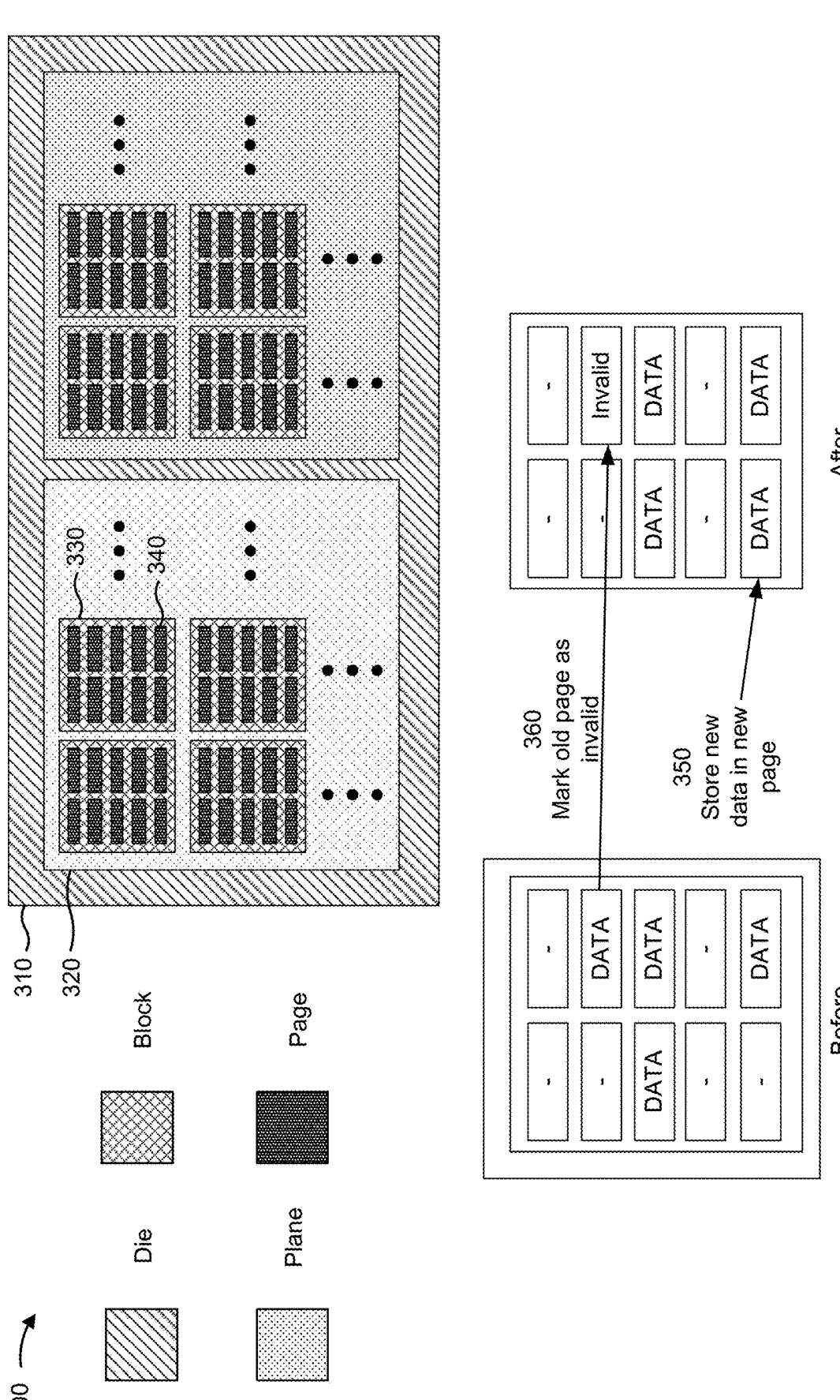
FIG. 3 is a diagram illustrating an example memory architecture that may be used by the memory device.

FIG. 3 is a diagram illustrating an example memory architecture 300 that may be used by the memory device 120. The memory device 120 may use the memory architecture 300 to store data. As shown, the memory architecture 300 may include a die 310, which may include multiple planes 320. A plane 320 may include multiple blocks 330. A block 330 may include multiple pages 340. Although FIG. 3 shows a particular quantity of planes 320 per die 310, a particular quantity of blocks 330 per plane 320, and a particular quantity of pages 340 per block 330, these quantities may be different than what is shown. In some implementations, the memory architecture 300 is a NAND memory architecture.

The die 310 is a structure made of semiconductor material, such as silicon. The memory device 120 may be fabricated on the die 310 (e.g., via a semiconductor device fabrication process). In some implementations, a die 310 is the smallest unit of memory that can independently execute commands. A memory chip or package may include one or more dies 310.

Each die 310 of a chip includes one or more planes 320. A plane 320 is sometimes called a memory plane. In some implementations, identical and concurrent operations can be performed on multiple planes 320 (sometimes with restrictions). Each plane 320 includes multiple blocks 330. A block 330 is sometimes called a memory block. Each block 330 includes multiple pages 340. A page 340 is sometimes called a memory page. A block 330 is the smallest unit of memory that can be erased. In other words, an individual page 340 of a block 330 cannot be erased without erasing every other page 340 of the block 330. A page 340 is the smallest unit of memory to which data can be written (i.e., the smallest unit of memory that can be programmed with data). The terminology "programming" memory and "writing to" memory may be used interchangeably. A page 340 may include multiple memory cells that are accessible via the same word line (sometimes called an access line). A word line may include a plurality of pages 340.

In some implementations, read and write operations are performed for a specific page 340, while erase operations are performed for a block 330 (e.g., all pages 340 in the block 330). In some implementations, to prevent wearing out of memory, all pages 340 of a block 330 may be programmed before the block 330 is erased to enable a new program operation to be performed to a page 340 of the block 330. After a page 340 is programmed with data (called "old data" below), that data can be erased, but that data cannot be overwritten with new data prior to being erased. The erase operation would erase all pages 340 in the block 330, and erasing the entire block 330 every time that new data is to replace old data would quickly wear out the memory cells of the block 330. Thus, rather than performing an erase operation, the new data may be stored in a new page (e.g., an empty page), as shown by reference number 350, and the old page that stores the old data may be marked as invalid, as shown by reference number 360. The memory device 120 may then point operations associated with the data to the new page and may track invalid pages to prevent program operations from being performed on invalid pages prior to an erase operation. When the pages 340 of a block 330 are full (e.g., all or some threshold quantity of pages are either invalid or store valid data), the memory device 120 may copy the valid data (e.g., to a new block or to the same block after erasure) and may erase the block 330.

As indicated above, FIG. 3 is provided as an example. Other examples may differ from what is described with regard to FIG. 3.

Figure 4:
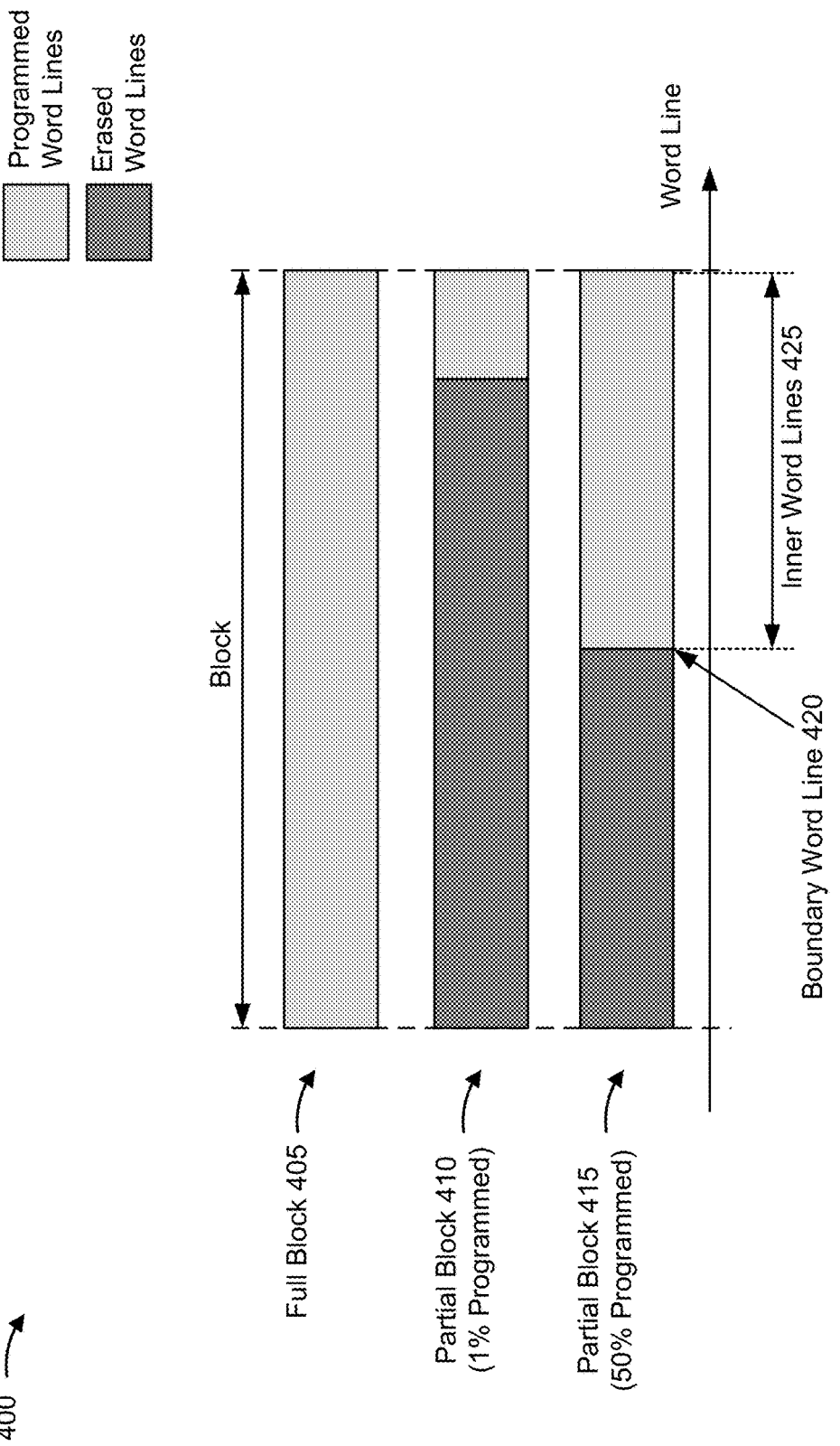
FIG. 4 is a diagram illustrating an example of different block types that can be used in the example memory architecture of the memory device.

FIG. 4 is a diagram illustrating an example 400 of different block types that can be used in the example memory architecture 300 of the memory device 120.

As shown in FIG. 4, an example block type may include a full block 405. A full block 405 refers to a block in which the word lines are fully programmed such that the LWP of the block corresponds to the maximum page of the block. Accordingly, a full block 405 refers to a block that does not include erased word lines, and is instead physically and logically closed.

As further shown in FIG. 4, another example block type may include a partial block type. FIG. 4 illustrates an example partial blocks 410 and 415. However, other examples of partial blocks are within the scope of the present disclosure. A partial block refers to a block of a memory that is physically open but logically closed. A partial block may include a subset of word lines that are programmed word lines, and another subset of word lines that are erased word lines. The example partial block 410 includes an example of a partial block that includes approximately 1% programmed word lines, and the example partial block 415 includes an example of a partial block that includes approximately 50% programmed word lines.

As further shown in FIG. 4, the programmed word lines of a partial block may include different types of word lines. For example, the programmed word lines of a partial block may include a boundary word line 420 and inner word lines 425. The boundary word line 420 includes a programmed word line that is adjacent to an erased word line in the partial block. All other programmed word lines in the partial block are referred to as inner word lines 425. Inner word lines 425 are non-boundary word lines that are not adjacent to an erased word line in the partial block.

As indicated above, FIG. 4 is provided as an example. Other examples may differ from what is described with regard to FIG. 4.

FIG. 5 is a diagram illustrating an example 500 of read operations for an MLC non-volatile memory device. Although the read operations described in connection with FIG. 5 are described in the context of an MLC, the described concepts also apply to other types of memory cells, such as SLCs, TLCs, QLCs, and other types of memory cells.

Some memory devices may be capable of storing multiple bits per memory cell. For example, an MLC non-volatile memory device (e.g., an MLC flash device) may be capable of storing two bits of information per memory cell in one of four states (e.g., may store binary 11, binary 01, binary 00, or binary 10 depending on a charge applied to the memory cell). To read the data of a memory cell, such as the MLC shown in FIG. 5, the memory device (or a component thereof) may apply a read reference voltage to the cell in an effort to induce current in the memory cell, and the memory device (or a component thereof) may determine a corresponding bit string associated with a voltage that induced (or else did not induce) current. Put another way, the memory device may apply various read reference voltages to sense the threshold voltage ($V_{th}$) associated with the data stored in the cell.

More particularly, for an MLC, the memory device may perform a lower page (also shown as LP) read and an upper page (also shown as UP) read. As shown by reference number 505, for a lower page read, the memory device may apply to a read reference voltage, shown as $V_B$. $V_B$ may represent a voltage between threshold voltage distributions associated with the first two states (e.g., threshold voltage distributions associated with binary 11 and 01) and threshold voltage distributions associated with the second two states (e.g., threshold voltage distributions associated with binary 00 and 10). If current flows when $V_B$ is applied to the memory cell, then the threshold voltage may be considered to be less than $V_B$, thus corresponding to one of binary 11 or binary 01 (meaning that the lower page data represents a "1"). If current does not flow when $V_B$ is applied to the memory cell, then the threshold voltage may be considered to be more than $V_B$, thus corresponding to one of binary 00 or binary 10 (meaning that the lower page data represents a "0").

As shown by reference number 510, an upper page read may be performed in a similar manner. More particularly, when the detected lower page data is a "1", a read reference voltage of $V_A$ may be applied to the memory cell to thereafter determine the upper page data. $V_A$ may represent a voltage between a threshold voltage distribution associated with the first state (e.g., a threshold voltage distribution associated with binary 11) and a threshold voltage distribution associated with the second state (e.g., a threshold voltage distribution associated with binary 01). If current flows when $V_A$ is applied to the memory cell, then the threshold voltage may be considered to be less than $V_A$, thus corresponding to binary 11 (meaning that the upper page data represents a "1"). If current does not flow when $V_A$ is applied to the memory cell, then the threshold voltage may be considered to be more than $V_A$ but less than $V_B$ (as determined during the lower page read), thus corresponding to binary 01 (meaning that the upper page data represents a "0").

Similarly, when the detected lower page data is a "0," a read reference voltage of $V_C$ may be applied to the memory cell to thereafter determine the upper page data. $V_C$ may represent a voltage between a threshold voltage distribution associated with the third state (e.g., a threshold voltage distribution associated with binary 00) and a threshold voltage distribution associated with the fourth state (e.g., a threshold voltage distribution associated with binary 10). If current flows when $V_C$ is applied to the memory cell, then the threshold voltage may be considered to be less than $V_C$ but more than $V_B$ (as determined during the lower page read), thus corresponding to binary 00 (meaning that the upper page data represents a "0"). If current does not flow when $V_C$ is applied to the memory cell, then the threshold voltage may be considered to be more than $V_C$, thus corresponding to binary 10 (meaning that the upper page data represents a "1").

As indicated above, FIG. 5 is provided as an example. Other examples may differ from what is described with regard to FIG. 5.

Figure 6:
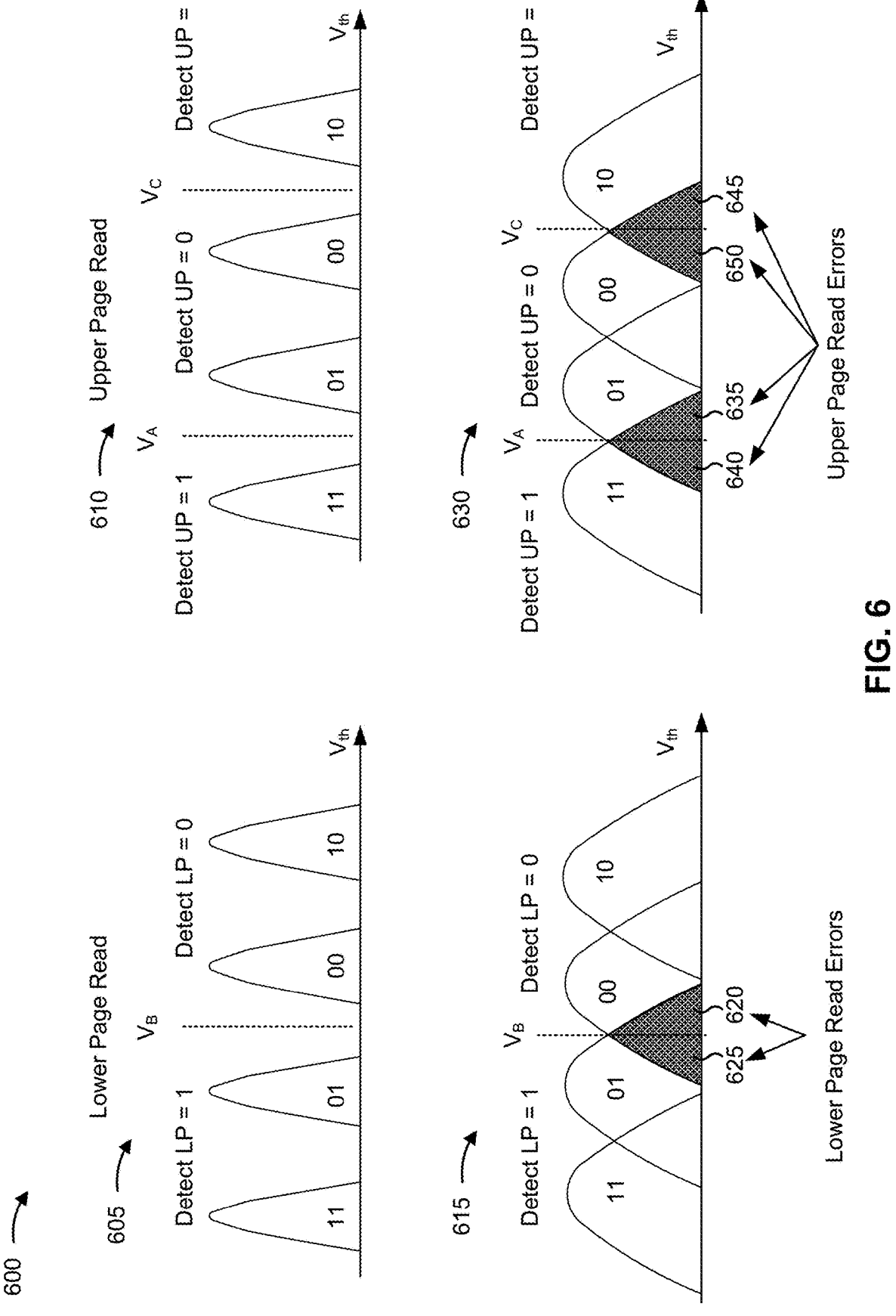
FIG. 6 is a diagram illustrating an example of read errors that may occur in an MLC non-volatile memory device.

FIG. 6 is a diagram illustrating an example 600 of read errors that may occur in an MLC non-volatile memory device. Although the read errors described in connection with FIG. 6 are described in the context of an MLC, the described concepts also apply to other types of memory cells, such as SLCs, TLCs, QLCs, and other types of memory cells.

Some memory devices may be capable of storing multiple bits per memory cell. For example, an MLC non-volatile memory device (e.g., an MLC flash device) may be capable of storing two bits of information per memory cell in one of four states (e.g., may store binary 11, binary 01, binary 00, or binary 10 depending on a charge applied to the memory cell). To read the data of a memory cell, such as the MLC shown in FIG. 6, the memory device (or a component thereof) may apply a read reference voltage to the cell in an effort to induce current in the memory cell, and the memory device (or a component thereof) may determine a corresponding bit string associated with a voltage that induced (or else did not induce) current. Put another way, the memory device may apply various read reference voltages to sense the threshold voltage ($V_{th}$) associated with the data stored in the cell.

More particularly, for an MLC, the memory device may perform a lower page (also shown as LP) read and an upper page (also shown as UP) read. As shown by reference number 605, for a lower page read, the memory device may apply to a read reference voltage, shown as $V_B$. $V_B$ may represent a voltage between threshold voltage distributions associated with the first two states (e.g., threshold voltage distributions associated with binary 11 and 01) and threshold voltage distributions associated with the second two states (e.g., threshold voltage distributions associated with binary 00 and 10). If current flows when $V_B$ is applied to the memory cell, then the threshold voltage may be considered to be less than $V_B$, thus corresponding to one of binary 11 or binary 01 (meaning that the lower page data represents a "1"). If current does not flow when $V_B$ is applied to the memory cell, then the threshold voltage may be considered to be more than $V_B$, thus corresponding to one of binary 00 or binary 10 (meaning that the lower page data represents a "0").

As shown by reference number 610, an upper page read may be performed in a similar manner. More particularly, when the detected lower page data is a "1", a read reference voltage of $V_A$ may be applied to the memory cell to thereafter determine the upper page data. $V_A$ may represent a voltage between a threshold voltage distribution associated with the first state (e.g., a threshold voltage distribution associated with binary 11) and a threshold voltage distribution associated with the second state (e.g., a threshold voltage distribution associated with binary 01). If current flows when $V_A$ is applied to the memory cell, then the threshold voltage may be considered to be less than $V_A$, thus corresponding to binary 11 (meaning that the upper page data represents a "1"). If current does not flow when $V_A$ is applied to the memory cell, then the threshold voltage may be considered to be more than $V_A$ but less than $V_B$ (as determined during the lower page read), thus corresponding to binary 01 (meaning that the upper page data represents a "0").

Similarly, when the detected lower page data is a "0," a read reference voltage of $V_C$ may be applied to the memory cell to thereafter determine the upper page data. $V_C$ may represent a voltage between a threshold voltage distribution associated with the third state (e.g., a threshold voltage distribution associated with binary 00) and a threshold voltage distribution associated with the fourth state (e.g., a threshold voltage distribution associated with binary 10). If current flows when $V_C$ is applied to the memory cell, then the threshold voltage may be considered to be less than $V_C$ but more than $V_B$ (as determined during the lower page read), thus corresponding to binary 00 (meaning that the upper page data represents a "0"). If current does not flow when $V_C$ is applied to the memory cell, then the threshold voltage may be considered to be more than $V_C$, thus corresponding to binary 10 (meaning that the upper page data represents a "1").

In some cases, the threshold voltage distributions shown in FIG. 6 may be broadened due to noise or the like, which may lead to read errors at the memory device. Noise in the memory cell may be caused by various sources, such as program-erase (P/E) cycling stress, charge leakage over time, read disturbances (e.g., disturbances caused by the application of a high voltage to a memory cell of a page not being read to deselect the cell while other cells on the page are being read), programming errors, cell-to-cell interference (such as unintentional electrical disturbance and/or interference of a memory cell when neighboring cells are read, written, or erased), or the like. As shown in FIG. 6, broadened voltage threshold distributions may lead to read errors, such as lower page read errors and/or upper page read errors.

First, as shown by reference number 615, a lower page read error may be caused by the broadening of voltage distributions that are near $V_B$ and/or that overlap with $V_B$. In the example shown in FIG. 6, the threshold voltage distributions associated with binary 01 and binary 00 have broadened to overlap with the read reference voltage $V_B$. This may result in a lower page read error because a cell programmed with binary 01 may act in a similar manner to a cell programmed with binary 00 (e.g., in response to an applied voltage). More particularly, if $V_B$ is applied to a memory cell that stores binary 01 but that is associated with a threshold voltage in the area labeled with reference number 620, no current would flow, erroneously indicating that the lower page data represents a "0" rather than a "1". On the other hand, if $V_B$ is applied to a memory cell that stores binary 00 but that is associated with a threshold voltage in the area labeled with reference number 625, current would flow, erroneously indicating that the lower page data represents a "1" rather than a "0".

Similarly, as shown by reference number 630, when performing an upper page read, an upper page read error may be caused by the broadening of voltage distributions that are near $V_A$ and/or $V_C$ and/or that overlap with $V_A$ and/or $V_C$. For example, memory cells storing binary 11 and associated with a threshold voltage in the area labeled by 635 may be erroneously read as storing upper page data of "0", memory cells storing binary 01 and associated with a threshold voltage in the area labeled by 640 may be erroneously read as storming upper page data of "1", memory cells storing binary 00 and associated with a threshold voltage in the area labeled by 645 may be erroneously read as storing upper page data of "1", and memory cells storing binary 10 and associated with a threshold voltage in the area labeled by 650 may be erroneously read as storing upper page data of "0".

In some cases, a memory device may attempt to adjust one or more read reference voltages in response to one or more of the read errors described above (e.g., in response to a cell storing one logical value or binary number being misread as storing a different logical value or binary number). In some instances, this may be referred to as a read retry or a read recovery process. In a read recovery process, one or more read reference voltages (such as $V_A$, $V_B$, or $V_C$ described in connection with the MLC) may be dynamically adjusted to track changes in threshold voltage distributions. More particularly, once a read process fails on a particular page of a memory, the memory device (and, more particularly, the controller and/or a read recovery component thereof) may attempt to recover the page using various read recovery steps, which use shifts in voltages from base read reference voltages. Put another way, the memory device may retry the read of a cell with an adjusted read reference voltage such that read errors are decreased or eliminated.

Alternatively, and as described herein, one or more read reference voltages may be adjusted based on one or more associated read voltage offsets to reduce the likelihood and/or the rate of read errors. For example, a $V_B$ read reference voltage may be adjusted (e.g., reduced or increased) in cases where a shift of drift in threshold voltage distributions occurs. This may enable progressive offset compensation for boundary word lines and inner word lines to increase data integrity for partial blocks, while reducing the need for additional padding and write cursors.

As indicated above, FIG. 6 is provided as an example. Other examples may differ from what is described with regard to FIG. 6.

Figure 7:
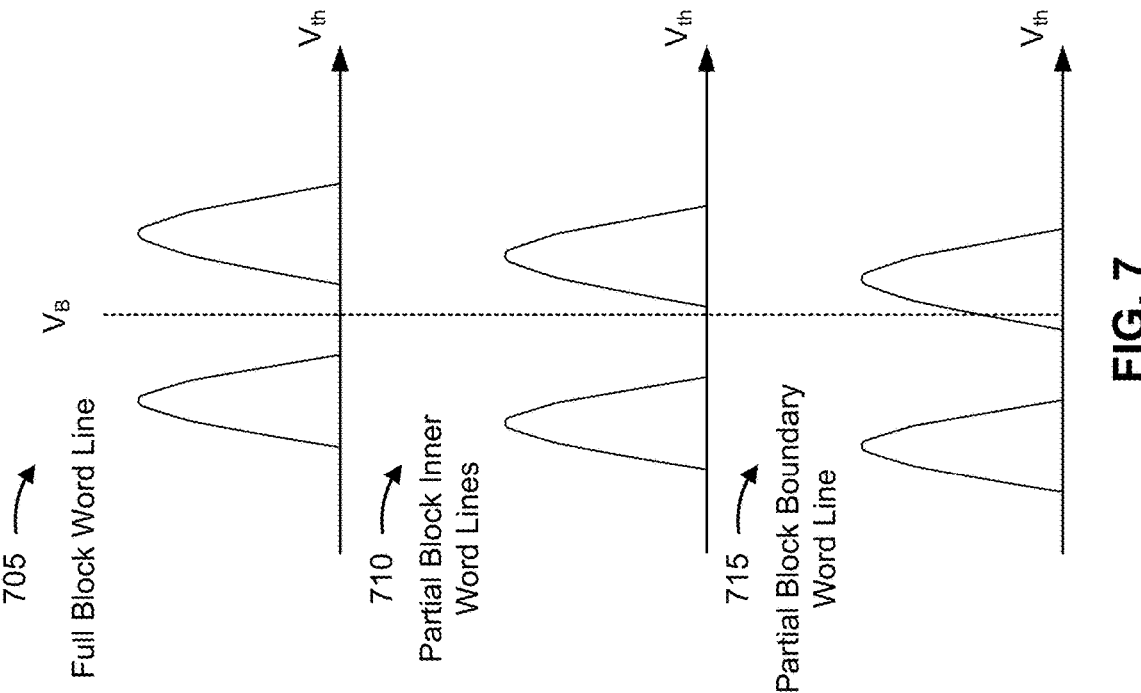
FIG. 7 is a diagram of an example of threshold voltage shifting for a plurality of types of word lines described herein.

FIG. 7 is a diagram of an example 700 of threshold voltage shifting for a plurality of types of word lines described herein.

As shown at 705, an example word line type may include a full block word line type. A full block word line type may correspond to a word line included in a full block (e.g., a block that is fully programmed/written to and closed).

As shown at 710, an example word line type may include a partial block inner word line type. A partial block inner word line type may correspond to an inner word line included in a partial block (e.g., a block having word lines that are erased, and is physically open but logically closed). As described above in connection with FIG. 4, an inner word line includes a non-boundary word line of a partial block (e.g., a word line that is not adjacent to an erased word line of the partial block). As shown at 710, the read threshold for the partial block inner word line type may be shifted relative to the read threshold voltages for the full block word line type such that the read reference voltage ($V_B$) is closer to one or more of the read threshold voltages of the partial block inner word line type relative to the read threshold voltages of the full block word line type. This may increase the likelihood of and/or the rate of read errors for word lines of the partial block inner word line type.

As shown at 715, an example word line type may include a partial block boundary word line type. A partial block boundary word line type may correspond to a boundary word line included in a partial block. As described above in connection with FIG. 4, a boundary word line includes a word line of a partial block that is not adjacent to an erased word line of the partial block. As shown at 715, the read threshold for the partial block boundary word line type may be shifted relative to the read threshold voltages for the full block word line type such that the read reference voltage is closer to one or more of the read threshold voltages of the partial block inner word line type relative to the read threshold voltages of the full block word line type. In some cases, this may cause one or more of the read threshold voltages of the partial block boundary word line type to overlap with the read reference voltage. This may increase the likelihood of and/or the rate of read errors for word lines of the partial block boundary word line type. Moreover, the magnitude of the read threshold voltage shift for the partial block boundary word line type may be greater relative to the magnitude of the read threshold voltage shift for the partial block inner word line type. This may result in the likelihood of and/or the rate of read errors being greater for word lines of the partial block boundary word line type relative to word lines of the partial block inner word line type.

As indicated above, FIG. 7 is provided as an example. Other examples may differ from what is described with regard to FIG. 7.

Figure 8:
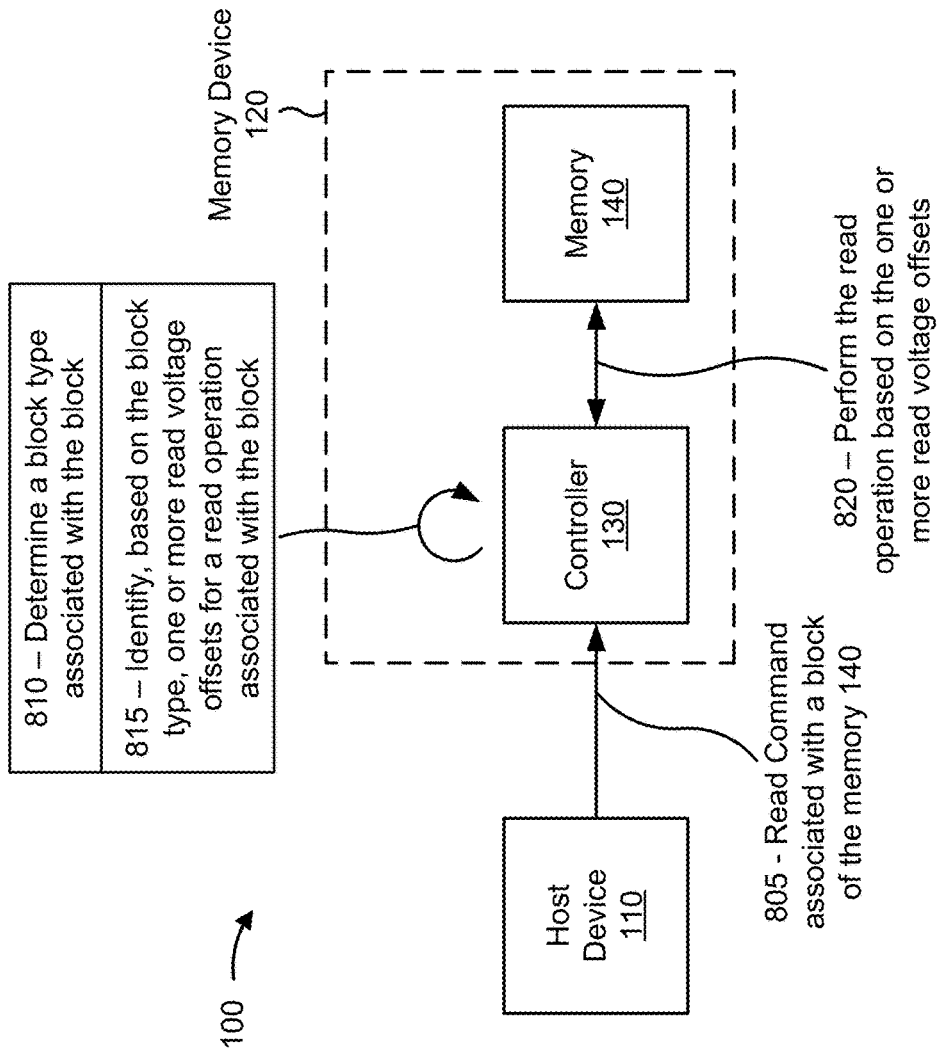
FIG. 8 is a diagram of an example of performing a read operation based on one or more read voltage offsets described herein.

FIG. 8 is a diagram of an example 800 of performing a read operation based on one or more read voltage offsets described herein. The one or more read voltage offsets may be used to account for and/or compensate for read threshold voltage shifting in memory cells that store partial blocks of data. In some implementations, the example 800 may be performed by the memory device 120. In some implementations, the example 800 may be performed by one or more components of the memory device 120, such as the controller 130 and/or the memory 140.

At 805, the controller 130 of the memory device 120 may receive a read command associated with a block of the memory 140. The block may be stored in one or more memory cells of the memory 140. In some implementations, the controller 130 receives the read command from the host device 110 via the host interface 150. In some implementations, the controller 130 receives the read command from another device on another interface.

At 810, the controller 130 may determine a block type associated with the block. For example, the controller 130 may determine that the block type associated with the block is a full block type. As another example, the controller 130 may determine that the block type associated with the block is a partial block type.

In some implementations, the controller 130 may determine the block type associated with the block based on a last written page (LWP) associated with the block. For example, the controller 130 may identify the LWP of the block, and may determine whether the LWP satisfies a threshold page of the block. The threshold page may correspond to the maximum page of the block. Accordingly, the controller 130 may determine whether the LWP is less than the maximum page of the block, and may determine the block type associated with the block based on whether the LWP is less than the maximum page of the block. For example, the controller 130 may determine that the block is a partial block type based on determining that the LWP of the block is less than the maximum page of the block. As another example, the controller 130 may determine that the block is a full block type based on determining that the LWP of the block is equal to (or correspond to) the maximum page of the block.

At 815, the controller 130 may identify, based on the block type of the block, one or more read voltage offsets for the read operation associated with the block. The controller 130 may identify the one or more read voltage offsets to account for and/or compensate for read threshold voltage shifting in memory cells that store the block. In some implementations, the controller 130 identifies the one or more read voltage offsets based on determining that the block type of the block is a partial block type. In some implementations, if the controller 130 determines that the block type of the block is a full block type, the controller 130 may refrain from identifying the one or more read voltage offsets because the one or more read voltage offsets may not be needed for word lines of a full block. Alternatively, the controller 130 may identify the one or more read voltage offsets for a full block.

In some implementations, the controller 130 determines the one or more read voltage offsets based on a characterization of the memory cells of the memory 140. For example, testing may be performed by measuring the magnitude of the read voltage shift when the memory cells store a partial block, and the controller 130 may determine the one or more read voltage offsets based on results of the testing and/or characterization.

In some implementations, the controller 130 identifies the one or more read voltage offsets in a look-up table (LUT) and/or in another type of data structure (e.g., a database) for partial blocks. The look-up table may be stored in the memory 140 (e.g., in a non-volatile memory array 210, in a volatile memory array 220) and/or in a local memory device on the controller 130. Here, the one or more read voltage offsets are characterized based on memory cells of the memory 140 and pre-loaded and/or updated in the memory device 120.

A read voltage offset may correspond to a value by which a corresponding read reference voltage is to be adjusted. For example, a read voltage offset may be –20 millivolts, which may indicate that a corresponding read reference voltage is to be adjusted by –20 millivolts. Alternatively, a read voltage offset may correspond to an adjusted read reference voltage. Here, the read voltage offset may explicitly indicate the corresponding adjusted read reference voltage, as opposed to a value by which the corresponding adjusted read reference voltage is to be determined.

At 820, the controller 130 may perform the read operation based on the one or more read voltage offsets. For example, the controller 130 may determine one or more adjusted read reference voltages associated with the block based on the one or more read voltage offsets, and may perform the read operation using the adjusted read reference voltages. For a partial block, the read threshold voltages of a memory cell storing the partial block may shift downward. In other words, the magnitudes of the read threshold voltages of a memory cell storing the partial block may decrease (e.g., by as many as 80 to 100 millivolts or greater). Accordingly, the controller 130 may reduce the read reference voltages based on the read voltage offsets to determine the one or more adjusted read reference voltages.

As indicated above, FIG. 8 is provided as an example. Other examples may differ from what is described with regard to FIG. 8.

Figure 9:
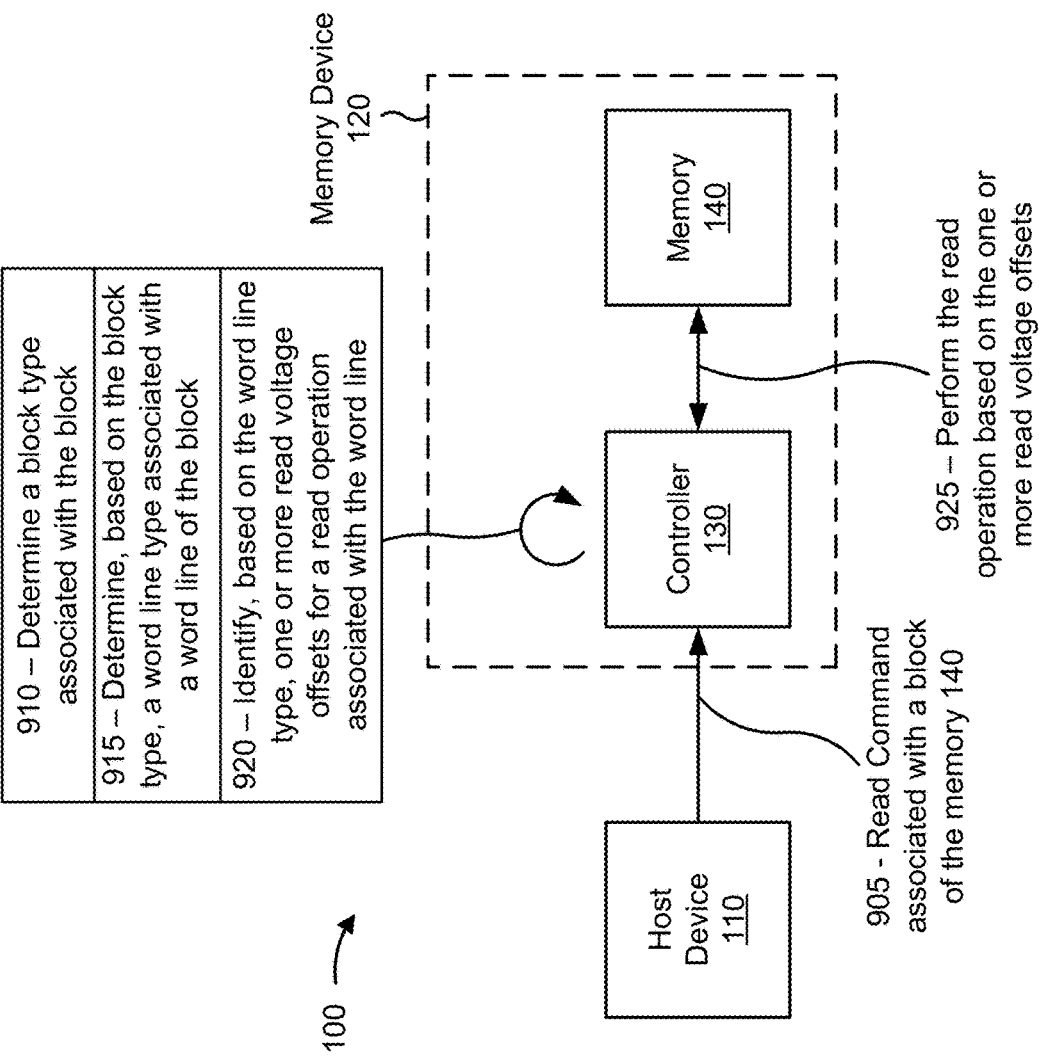
FIG. 9 is a diagram of an example of performing a read operation based on one or more read voltage offsets described herein.

FIG. 9 is a diagram of an example 900 of performing a read operation based on one or more read voltage offsets described herein. The one or more read voltage offsets may be used to account for and/or compensate for read threshold voltage shifting in memory cells that store partial blocks of data. In some implementations, the example 900 may be performed by the memory device 120. In some implementations, the example 900 may be performed by one or more components of the memory device 120, such as the controller 130 and/or the memory 140.

At 905, the controller 130 of the memory device 120 may receive a read command associated with a block of the memory 140. The block may be stored in one or more memory cells of the memory 140. In some implementations, the controller 130 receives the read command from the host device 110 via the host interface 150. In some implementations, the controller 130 receives the read command from another device on another interface.

At 910, the controller 130 may determine a block type associated with the block. For example, the controller 130 may determine that the block type associated with the block is a full block type. As another example the controller 130 may determine that the block type associated with the block is a partial block type. The controller 130 may determine the block type in a similar manner as described above in connection with FIG. 8.

At 915, the controller 130 may determine, based on the block type of the block, a word line type associated with a word line of the block. In some implementations, the controller 130 identifies the word line type based on determining that the block type of the block is a partial block type. In some implementations, if the controller 130 determines that the block type of the block is a full block type, the controller 130 may refrain from identifying the word line type of the word line because the one or more read voltage offsets may not be needed for word lines of a full block. Alternatively, the controller 130 may identify the word line types for a full block.

In some implementations, the controller 130 may determine the word line type of the word line based on whether the word line is associated with an LWP of the block. For example, the controller 130 may determine that the word line is a programmed word line (e.g., data of a partial block is written to the word line), may determine that the word line is associated with an LWP of the block, and may determine that the word line type is a boundary word line based on determining that the word line is a programmed word line and is associated with the LWP of the block. As another example, the controller 130 may determine that the word line is a programmed word line (e.g., data of a partial block is written to the word line), may determine that the word line is not associated with an LWP of the block, and may determine that the word line type is an inner word line (e.g., a non-boundary word line) based on determining that the word line is a programmed word line and is not associated with the LWP of the block.

At 920, the controller 130 may identify, based on the word line type associated with the word line, one or more read voltage offsets for the read operation associated with the word line. The controller 130 may identify the one or more read voltage offsets to account for and/or compensate for read threshold voltage shifting in memory cells that store the word line. In some implementations, the controller 130 identifies one or more inner word line read voltage offsets based on determining that the word line type of the word line is an inner word line. In some implementations, the controller 130 identifies one or more boundary word line read voltage offsets based on determining that the word line type of the word line is a boundary word line. In some implementations, if the controller 130 determines that the block type of the block is a full block type, the controller 130 may refrain from identifying the one or more read voltage offsets because the one or more read voltage offsets may not be needed for word lines of a full block. Alternatively, controller 130 may identify the one or more read voltage offsets for a full block.

In some implementations, the controller 130 identifies the one or more read voltage offsets in a look-up table and/or in another type of data structure (e.g., a database) for partial blocks. A plurality of look-up tables may be stored in the memory device 120 (e.g., in the memory 140, in a non-volatile memory array 210, in a volatile memory array 220, and/or in a local memory device on the controller 130). The plurality of look-up tables may include an inner word line look-up table (e.g., a non-boundary word line look-up table) and a boundary word line look-up table, among other examples. This enables different read voltage offsets to be used with different word line types to enable optimization of read voltage offsets for different word line types. In this way, the read voltage offsets that are to be used for inner word lines may be characterized based on the operation of memory cells of the memory 140 when storing inner word lines, and the read voltage offsets that are to be used for boundary word lines may be characterized based on the operation of memory cells of the memory 140 when storing boundary word lines. Generally, the magnitudes of the read voltage offsets for boundary word lines may be greater relative to the magnitudes of the read voltage offsets for inner word lines due to the greater read threshold voltage shifting that is experienced in boundary word lines.

At 925, the controller 130 may perform the read operation for the word line based on the one or more read voltage offsets identified for the word line. For example, the controller 130 may determine one or more adjusted read reference voltages associated with the word line based on the one or more read voltage offsets, and may perform the read operation for the word line using the adjusted read reference voltages.

The controller 130 may perform the operations described in connection with 910-925 for other word lines of the block (e.g., a partial block). For example, the controller 130 may identify boundary word line read voltage offsets for a boundary word line of a partial block (e.g., in a boundary word line look-up table or another data structure) and may perform a read operation for the boundary word line, and may identify inner word line read voltage offsets for one or more inner word lines of the partial block (e.g., in an inner word line look-up table or another data structure) and may perform a read operation for the inner word lines. The combination of boundary word line read voltage offsets and the combination of inner word line read voltage offsets may include different combinations of read voltage offsets.

As indicated above, FIG. 9 is provided as an example. Other examples may differ from what is described with regard to FIG. 9.

FIGS. 10A and 10B are examples of reference voltage offset look-up tables described herein. Example 1000 in FIG. 10A is an example of a boundary word line look-up table. Example 1010 in FIG. 10B is an example of an inner word line look-up table.

As shown in FIG. 10A, the boundary word line look-up table may include a plurality of m columns and a plurality of n rows. The columns may correspond to levels (e.g., Level 1 through Level m) of a memory cell. The rows may correspond to percentage ranges of block utilization. For example, a first row may correspond to a range of 0% to 2% utilization (e.g., between 0% and 2% of the block has been written to and not erased), a second row may correspond to a range of 2% to 10%, and so on. This enables the controller 130 to identify one or more read voltage offsets for a read operation associated with a boundary word line based on the percentage of utilized word lines of an associated block that includes the boundary word line.

The boundary word line look-up table may include or indicate a plurality of read voltage offsets for use with memory cells that store a boundary word line of a partial block. The controller 130 may determine that a block associated with a read command is a partial block, may determine that a word line of the partial block is a boundary word line, and may identify the read voltage offset(s) that are to be used for the levels of the memory cells storing the boundary word line.

As an example of the above, the controller 130 may determine that the utilization of (or the fill % of) the partial block is 35%. The controller 130 may therefore identify row 5 in the boundary word line look-up table, and may apply Offset 5-1 through Offset 5-m to the read reference voltages of Level 1 through Level m, respectively, of a memory cell storing the boundary word line of the partial block.

As shown in FIG. 10B, the inner word line look-up table may include a plurality of x columns and a plurality of y rows. The columns may correspond to levels (e.g., Level 1 through Level x) of a memory cell. The rows may correspond to ranges of block utilization. For example, a first row may correspond to a range of 0% to 2% utilization (e.g., between 0% and 2% of the block has been written to and not erased), a second row may correspond to a range of 2% to 10%, and so on. This enables the controller 130 to identify one or more read voltage offsets for a read operation associated with an inner word line based on the percentage of utilized word lines of an associated block that includes the inner word line.

The inner word line look-up table may include or indicate a plurality of read voltage offsets for use with memory cells that store an inner word line of a partial block. The controller 130 may determine that a block associated with a read command is a partial block, may determine that a word line of the partial block is an inner word line, and may identify the read voltage offset(s) that are to be used for the levels of the memory cells storing the inner word line.

As an example of the above, the controller 130 may determine that the utilization of (or the fill % of) the partial block is 13%. The controller 130 may therefore identify row 3 in the inner word line look-up table, and may apply Offset 5-1 through Offset 3-x to the read reference voltages of Level 1 through Level x, respectively, of a memory cell storing the inner word line of the partial block.

As indicated above, FIGS. 10A and 10B are provided as examples. Other examples may differ from what is described with regard to FIGS. 10A and 10B.

Figure 11:
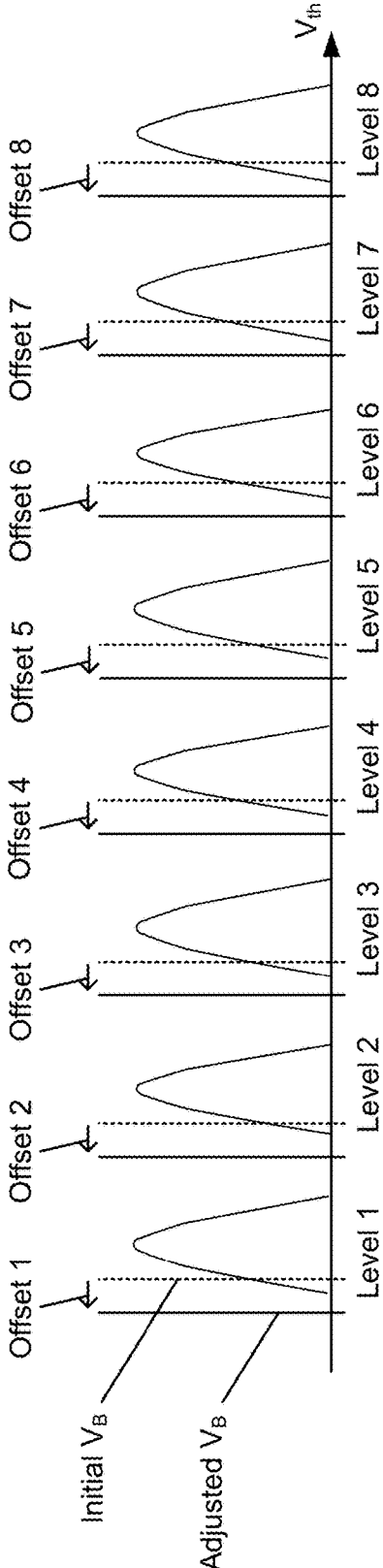
FIG. 11 is a diagram illustrating an example of read voltage offsets applied to a plurality of read reference voltages of a memory cell.

FIG. 11 is a diagram illustrating an example 1100 of read voltage offsets applied to a plurality of read reference voltages ($V_B$) of a memory cell. In particular, the example 1100 includes an example of read voltage offsets (e.g., Offset 1 through Offset 8) applied to a plurality of read reference voltages ($V_B$) of a TLC memory cell (e.g., a memory cell having eight (8) threshold voltage levels—Level 1 through Level 8). However, the read voltage offsets described herein may be applied to a plurality of read reference voltages ($V_B$) in another type of a memory cell in a similar manner.

As shown in FIG. 11, the initial read reference voltages may overlap with the threshold voltages ($V_{th}$) of the different threshold voltage levels of the TLC memory cell. This may occur, for example, due to shifting of threshold voltage levels for boundary word lines or an inner word line of a partial block stored in the TLC memory cell. Read voltage offsets may be applied to respective initial read reference voltages to determine adjusted read reference voltages. As shown in FIG. 11, the shifting of threshold voltage levels may be to the left, meaning that the threshold voltage levels may shift lower in magnitude. Accordingly, the read voltage offsets may be applied to respective initial read reference voltages to determine adjusted read reference voltages that are comparatively lower in magnitude relative to the initial read reference voltages. In this way, when a read operation is performed for the TLC memory cell, the adjusted read reference voltages are used, which reduces the likelihood of overlap of the adjusted read reference voltages with the threshold voltage curves of the Levels 1-8 of the TLC memory cell.

Generally, the quantity of read voltage offsets identified by the controller 130 for a word line may be based on the memory cell type of the memory cells storing a partial block. For example, the controller 130 may determine a particular read voltage offset that corresponds to a respective threshold voltage level of memory cells of the memory 140 storing the partial block. As an example, the controller 130 may identify the Offset 1 for the Level 1 of the memory cell, may identify the Offset 2 for the Level 2 of the memory cell, and so on.

In some implementations, the quantity of read voltage offsets identified by the controller 130 for a word line may be based on the quantity of levels of the memory cell(s) storing the word line. For example, the quantity of the one or more read voltage offsets that is identified by the controller 130 may be greater for a TLC memory cell type relative to an SLC memory cell type. As another example, the quantity of the one or more read voltage offsets that is identified by the controller 130 may be greater for a QLC memory cell type relative to a TLC memory cell type. As another example, the quantity of the one or more read voltage offsets that is identified may be greater for a hex-level cell (HLC) memory cell type relative to a penta-level cell (PLC) memory cell type, relative to a quad-level cell (QLC) memory cell type, relative to a triple-level cell (TLC) memory cell type, relative to a multi-level cell (MLC) type, and relative to a single level cell (SLC) memory cell type.

As indicated above, FIG. 11 is provided as an example. Other examples may differ from what is described with regard to FIG. 11.

Figure 12:
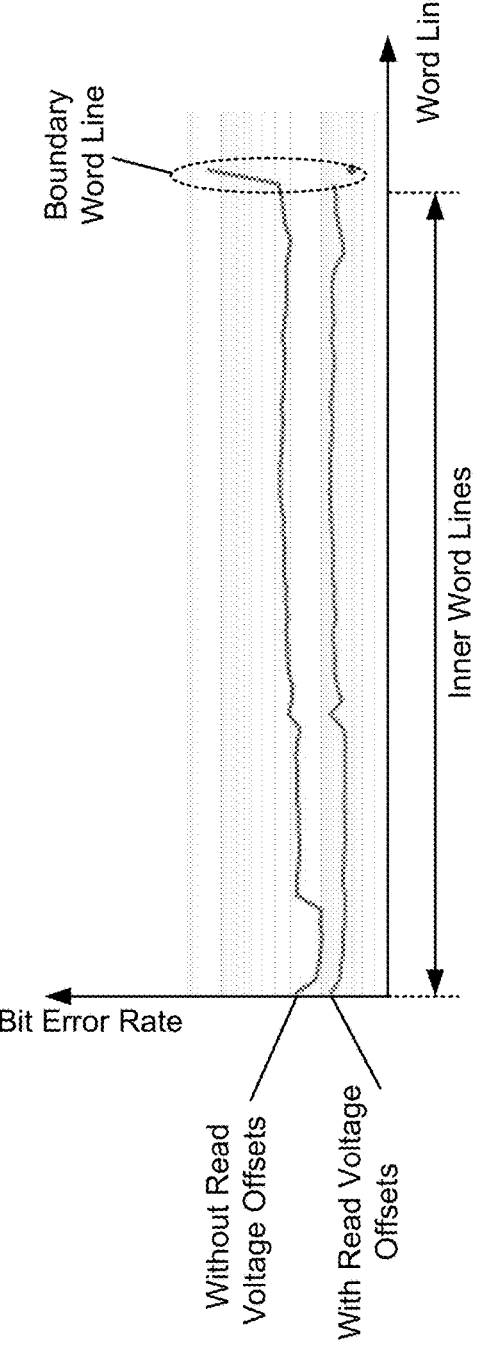
FIG. 12 is a diagram illustrating an example of bit error rates in word lines of a partial block stored in the memory of the memory device described herein.

FIG. 12 is a diagram illustrating an example 1200 of bit error rates in word lines of a partial block stored in the memory 140 of the memory device 120 described herein. As shown in FIG. 12, bit error rates for inner word lines of the partial block may be greater without the read voltage offsets described herein relative to the bit error rates for the inner word lines of the partial block when the read voltage offsets described herein are used. In some implementations, the reduction in bit error rate in the inner word lines resulting from the use of the read voltage offsets described herein may be approximately three times less relative to the bit error rates for the inner word lines of the partial block without the read voltage offsets described herein.

Moreover, a bit error rate for the boundary word line of the partial block may be greater without the read voltage offsets described herein relative to the bit error rate for the boundary word line of the partial block when the read voltage offsets described herein are used. In some implementations, the reduction in bit error rate in the boundary word line resulting from the use of the read voltage offsets described herein may be included in a range of approximately 40 times less to approximately 60 times less relative to the bit error rate for the boundary word line of the partial block without the read voltage offsets described herein.

As indicated above, FIG. 12 is provided as an example. Other examples may differ from what is described with regard to FIG. 12.

Figure 13:
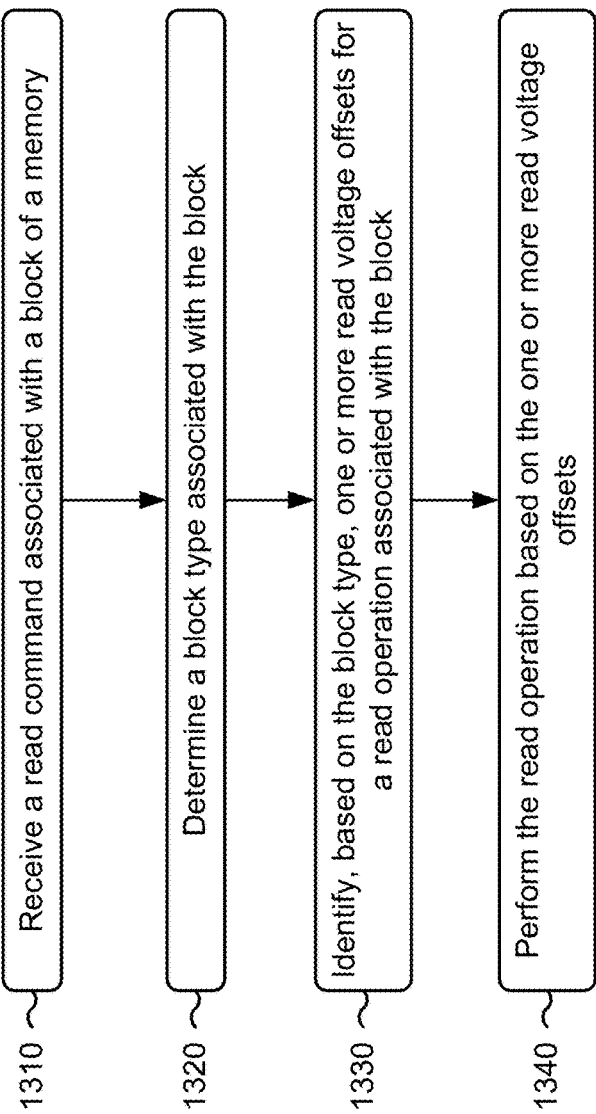
FIG. 13 is a flowchart of an example method associated with a partial block read voltage offset.

FIG. 13 is a flowchart of an example method 1300 associated with a partial block read voltage offset. In some implementations, a memory device (e.g., the memory device 120) may perform or may be configured to perform one or more process blocks of FIG. 13. In some implementations, another device or a group of devices separate from or including the memory device (e.g., the controller 130, the memory 140, the memory management component 250, the voltage offset component 260) may perform or may be configured to perform one or more process blocks of FIG. 13.

As shown in FIG. 13, the method 1300 may include receiving a read command associated with a block of the memory (block 1310). As further shown in FIG. 13, the method 1300 may include determining a block type associated with the block (block 1320). As further shown in FIG. 13, the method 1300 may include identifying, based on the block type, one or more read voltage offsets for a read operation associated with the block (block 1330). As further shown in FIG. 13, the method 1300 may include performing the read operation based on the one or more read voltage offsets (block 1340).

Although FIG. 13 shows example blocks of a method 1300, in some implementations, the method 1300 may include additional blocks, fewer blocks, different blocks, or differently arranged blocks than those depicted in FIG. 13. Additionally, or alternatively, two or more of the blocks of the method 1300 may be performed in parallel. The method 1300 is an example of one method that may be performed by one or more devices described herein. These one or more devices may perform or may be configured to perform one or more other methods based on operations described herein, such as the operations described in connection with FIGS. 8-12.

FIG. 14 is a flowchart of an example method 1400 associated with a partial block read voltage offset. In some implementations, a memory device (e.g., the memory device 120) may perform or may be configured to perform one or more process blocks of FIG. 14. In some implementations, another device or a group of devices separate from or including the memory device (e.g., the controller 130, the memory 140, the memory management component 250, the voltage offset component 260) may perform or may be configured to perform one or more process blocks of FIG. 14.

As shown in FIG. 14, the method 1400 may include receiving a read command associated with a block of a memory of the memory device (block 1410). As further shown in FIG. 14, the method 1400 may include determining that a block type associated with the block is a partial block type (block 1420). As further shown in FIG. 14, the method 1400 may include determining a word line type associated with a word line of the block (block 1430). As further shown in FIG. 14, the method 1400 may include identifying one or more read voltage offsets for a read operation associated with the word line (block 1440). As further shown in FIG. 14, the method 1400 may include performing the read operation based on the one or more read voltage offsets (block 1450).

Although FIG. 14 shows example blocks of a method 1400, in some implementations, the method 1400 may include additional blocks, fewer blocks, different blocks, or differently arranged blocks than those depicted in FIG. 14. Additionally, or alternatively, two or more of the blocks of the method 1400 may be performed in parallel. The method 1400 is an example of one method that may be performed by one or more devices described herein. These one or more devices may perform or may be configured to perform one or more other methods based on operations described herein, such as the operations described in connection with FIGS. 8-12.

FIG. 15 is a flowchart of an example method 1500 associated with a partial block read voltage offset. In some implementations, a memory device (e.g., the memory device 120) may perform or may be configured to perform one or more process blocks of FIG. 15. In some implementations, another device or a group of devices separate from or including the memory device (e.g., the controller 130, the memory 140, the memory management component 250, the voltage offset component 260) may perform or may be configured to perform one or more process blocks of FIG. 15.

As shown in FIG. 15, the method 1500 may include receiving a read command associated with a block of a memory included in the one or more components (block 1510). As further shown in FIG. 15, the method 1500 may include determining a block type associated with the block (block 1520). As further shown in FIG. 15, the method 1500 may include identifying, based on the block type, one or more read voltage offsets for a read operation associated with the block, wherein a quantity of the one or more read voltage offsets that is identified is based on memory cell type of memory cells of the memory storing the block (block 1530). As further shown in FIG. 15, the method 1500 may include performing the read operation based on the one or more read voltage offsets (block 1540).

Although FIG. 15 shows example blocks of a method 1500, in some implementations, the method 1500 may include additional blocks, fewer blocks, different blocks, or differently arranged blocks than those depicted in FIG. 15. Additionally, or alternatively, two or more of the blocks of the method 1500 may be performed in parallel. The method 1500 is an example of one method that may be performed by one or more devices described herein. These one or more devices may perform or may be configured to perform one or more other methods based on operations described herein, such as the operations described in connection with FIGS. 8-12.

Figure 16:
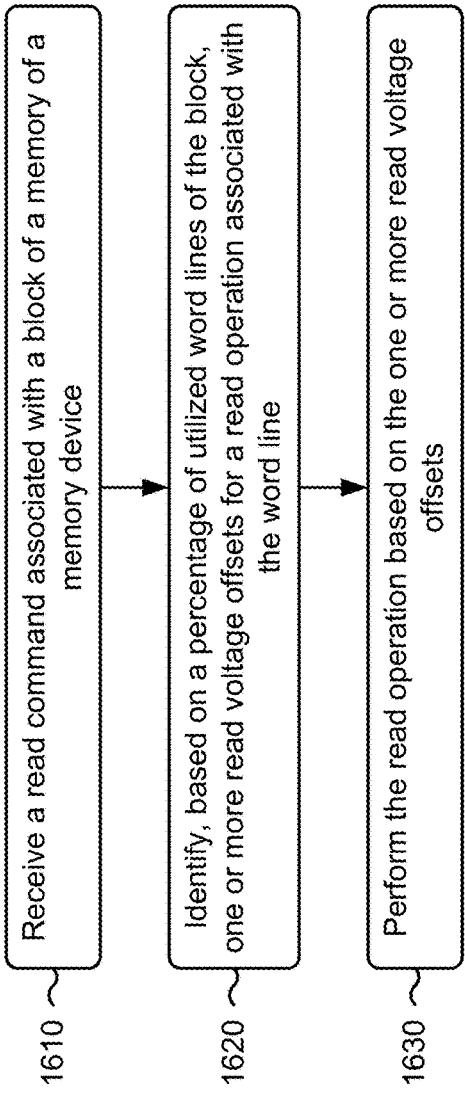
FIG. 16 is a flowchart of an example method associated with a partial block read voltage offset.

FIG. 16 is a flowchart of an example method 1600 associated with a partial block read voltage offset. In some implementations, a memory device (e.g., the memory device 120) may perform or may be configured to perform one or more process blocks of FIG. 16. In some implementations, another device or a group of devices separate from or including the memory device (e.g., the controller 130, the memory 140, the memory management component 250, the voltage offset component 260) may perform or may be configured to perform one or more process blocks of FIG. 16.

As shown in FIG. 16, the method 1600 may include receiving a read command associated with a block of a memory of the memory device (block 1610). As further shown in FIG. 16, the method 1600 may include identifying, based on a percentage of utilized word lines of the block, one or more read voltage offsets for a read operation associated with the word line (block 1620). As further shown in FIG. 16, the method 1600 may include performing the read operation based on the one or more read voltage offsets (block 1630).

Although FIG. 16 shows example blocks of a method 1600, in some implementations, the method 1600 may include additional blocks, fewer blocks, different blocks, or differently arranged blocks than those depicted in FIG. 16. Additionally, or alternatively, two or more of the blocks of the method 1600 may be performed in parallel. The method 1600 is an example of one method that may be performed by one or more devices described herein. These one or more devices may perform or may be configured to perform one or more other methods based on operations described herein, such as the operations described in connection with FIGS. 8-12.

FIG. 17 is a flowchart of an example method 1700 associated with a partial block read voltage offset. In some implementations, a memory device (e.g., the memory device 120) may perform or may be configured to perform one or more process blocks of FIG. 17. In some implementations, another device or a group of devices separate from or including the memory device (e.g., the controller 130, the memory 140, the memory management component 250, the voltage offset component 260) may perform or may be configured to perform one or more process blocks of FIG. 17.

As shown in FIG. 17, the method 1700 may include receiving a read command associated with a block of the memory (block 1710). As further shown in FIG. 17, the method 1700 may include determining that block type associated with the block is a partial block type (block 1720). As further shown in FIG. 17, the method 1700 may include determining, based on determining that the block type is the partial block type, a first word line of the block and a second word line of the block (block 1730). As further shown in FIG. 17, the method 1700 may include identifying one or more first read voltage offsets for a first read operation associated with the first word line (block 1740). As further shown in FIG. 17, the method 1700 may include identifying one or more second read voltage offsets for a second read operation associated with the second word line (block 1750). As further shown in FIG. 17, the method 1700 may include performing the first read operation based on the one or more first read voltage offsets (block 1760). As further shown in FIG. 17, the method 1700 may include performing the second read operation based on the one or more second read voltage offsets (block 1770).

Although FIG. 17 shows example blocks of a method 1700, in some implementations, the method 1700 may include additional blocks, fewer blocks, different blocks, or differently arranged blocks than those depicted in FIG. 17. Additionally, or alternatively, two or more of the blocks of the method 1700 may be performed in parallel. The method 1700 is an example of one method that may be performed by one or more devices described herein. These one or more devices may perform or may be configured to perform one or more other methods based on operations described herein, such as the operations described in connection with FIGS. 8-12.

In some implementations, a memory device includes a memory; and a controller, configured to: receive a read command associated with a block of the memory; determine a block type associated with the block; identify, based on the block type, one or more read voltage offsets for a read operation associated with the block; and perform the read operation based on the one or more read voltage offsets.

In some implementations, a memory device includes one or more components, configured to: receive a read command associated with a block of a memory included in the one or more components; determine a block type associated with the block; identify, based on the block type, one or more read voltage offsets for a read operation associated with the block, wherein a quantity of the one or more read voltage offsets that is identified is based on memory cell type of memory cells of the memory storing the block; and perform the read operation based on the one or more read voltage offsets.

In some implementations, a method includes receiving, by a memory controller of a memory device, a read command associated with a block of a memory of the memory device; identifying, by the memory controller and based on a percentage of utilized word lines of the block, one or more read voltage offsets for a read operation associated with the word line; and performing, by the memory controller, the read operation based on the one or more read voltage offsets.

In some implementations, a memory device includes a memory; and a controller, configured to: receive a read command associated with a block of the memory; determine that block type associated with the block is a partial block type; determine, based on determining that the block type is the partial block type, a first word line of the block and a second word line of the block; identify one or more first read voltage offsets for a first read operation associated with the first word line; identify one or more second read voltage offsets for a second read operation associated with the second word line; perform the first read operation based on the one or more first read voltage offsets; and perform the second read operation based on the one or more second read voltage offsets.

In some implementations, a method includes receiving, by a controller of a memory device, a read command associated with a block of a memory of the memory device; determining, by the controller, that a block type associated with the block is a partial block type; determining, by the controller based on the block type associated with the block being a partial block type, a word line type associated with a word line of the block; identifying, by the controller, one or more read voltage offsets for a read operation associated with the word line; and performing, by the controller, the read operation based on the one or more read voltage offsets.

The foregoing disclosure provides illustration and description but is not intended to be exhaustive or to limit the implementations to the precise forms disclosed. Modifications and variations may be made in light of the above disclosure or may be acquired from practice of the implementations described herein.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A memory device, comprising:
   a memory; and
   a controller, configured to:
   receive a read command associated with a block of the memory;
   determine that a block type associated with the block is a partial block type in which at least a portion of word lines of the block are erased;
   identify, based on the block type being the partial block type, one or more read voltage offsets for a read operation associated with the block;
   determine one or more adjusted read reference voltages associated with the block based on the one or more read voltage offsets; and
   perform the read operation using the adjusted read reference voltages based on the one or more read voltage offsets.

2. The memory device of claim 1, wherein the controller is configured to:
   determine that a last written page (LWP) of the block is less than a maximum page of the block; and
   determine that the block type is the partial block type based on determining that the LWP of the block is less than a maximum page of the block.

3. The memory device of claim 1, wherein the controller is configured to:
   identify the one or more read voltage offsets in a look-up table stored in the memory device.

4. The memory device of claim 1, wherein the one or more read voltage offsets are characterized based on memory cells of the memory.

5. A method, comprising:
   receiving, by a controller of a memory device, a read command associated with a block of a memory of the memory device;
   determining, by the controller, that a block type associated with the block is a partial block type;
   determining, by the controller based on the block type associated with the block being a partial block type, a word line type associated with a word line of the block;
   identifying, by the controller, one or more read voltage offsets for a read operation associated with the word line;
   identifying, for another read operation associated with another word line of the block, another one or more read voltage offsets in an inner word line look-up table stored by the controller; and
   performing, by the controller, the read operation based on the one or more read voltage offsets.

6. The method of claim 5, wherein determining the block type associated with the block comprises:

determining that the block type is the partial block type in which at least a portion of word lines of the block are erased; and
wherein determining, based on determining that the block type is the partial block type, the word line type associated with the word line of the block.

7. The method of claim 5, wherein determining the word line type associated with the word line comprises:
   determining that the word line is a programmed word line;
   determining that the word line is associated with a last written page (LWP) of the block; and
   determining that the word line type is a boundary word line based on determining that the word line is a programmed word line and is associated with the LWP of the block.

8. The method of claim 7, wherein identifying the one or more read voltage offsets comprises:
   identifying the one or more read voltage offsets based on a boundary word line look-up table stored by the controller.

9. The method of claim 5, wherein determining the word line type associated with the word line comprises:
   determining that the word line is a programmed word line;
   determining that the word line is not associated with a last written page (LWP) of the block; and
   determining that the word line type is an inner word line based on determining that the word line is a programmed word line and is not associated with the LWP of the block.

10. A memory device, comprising:
    one or more components, configured to:
    receive a read command associated with a block of a memory included in the one or more components;
    determine that a block type associated with the block is a partial block type in which at least a portion of word lines of the block are erased;
    identify, based on the block type being the partial block type, one or more read voltage offsets for a read operation associated with the block,
    wherein a quantity of the one or more read voltage offsets that is identified is based on memory cell type of memory cells of the memory storing the block; and
    perform the read operation based on the one or more read voltage offsets.

11. The memory device of claim 10, wherein the quantity of the one or more read voltage offsets that is identified is greater for a triple-level cell (TLC) memory cell type relative to a single-level cell (SLC) memory cell type.

12. The memory device of claim 10, wherein the quantity of the one or more read voltage offsets that is identified is greater for a hex-level cell (HLC) memory cell type relative to a penta-level cell (PLC) memory cell type, relative to a quad-level cell (QLC) memory cell type, relative to a triple-level cell (TLC) memory cell type, relative to a multi-level cell (MLC) type, and relative to a single level cell (SLC) memory cell type.

13. The memory device of claim 10, wherein the one or more components are configured to:
    determine one or more adjusted read reference voltages associated with the block based on the one or more read voltage offsets; and
    perform the read operation using the adjusted read reference voltages.

14. The memory device of claim 13, wherein the one or more components are configured to:

reduce one or more read reference voltages associated with the block based on the one or more read voltage offsets to determine the one or more adjusted read reference voltages.

15. The memory device of claim 10, wherein each of the one or more read voltage offsets corresponds to a respective threshold voltage level of the memory cells of the memory storing the block.

16. The memory device of claim 10, wherein the one or more components are configured to:
   determine that a last written page (LWP) of the block is less than a maximum page of the block; and
   determine that the block type is the partial block type based on determining that the LWP of the block is less than a maximum page of the block.

17. A method, comprising:
   receiving, by a memory controller of a memory device, a read command associated with a block of a memory of the memory device;
   identifying, by the memory controller and based on a percentage of utilized word lines of the block, one or more read voltage offsets for a read operation associated with a word line; and
   performing, by the memory controller, the read operation based on the one or more read voltage offsets.

18. The method of claim 17, wherein identifying the one or more read voltage offsets comprises:
   identifying a row in a look-up table based on the percentage of utilized word lines of the block; and
   identifying the one or more read voltage offsets indicated in the row.

19. The method of claim 18, wherein identifying the row in a look-up table comprises:
   determining that the percentage of utilized word lines of the block is within a percentage range associated with the row; and
   identifying the row in the look-up table based determining that the percentage of utilized word lines of the block is within the percentage range associated with the row.

20. The method of claim 18, further comprising:
   determining a word line type associated with a word line of the block; and
   identifying the look-up table based on the word line type associated with the word line.

21. The method of claim 20, wherein determining the word line type comprises:
   determining that the word line type is a boundary word line type; and
   wherein identifying the look-up table comprises:
      identifying a boundary word line look-up table.

22. The method of claim 20, wherein determining the word line type comprises:
   determining that the word line type is an inner word line type; and
   wherein identifying the look-up table comprises:
      identifying an inner word line look-up table.

23. A memory device, comprising:
   a memory; and
   a controller, configured to:
      receive, from a host device, a read command associated with a block of the memory;
      determine that a block type associated with the block is a partial block type;
      determine, based on determining that the block type is the partial block type, a first word line of the block and a second word line of the block;
      issue a first read on the first word line and a second read on the second word line;
      identify one or more first read voltage offsets for a first read operation associated with the first word line;
      identify one or more second read voltage offsets for a second read operation associated with the second word line;
      perform the first read operation based on the one or more first read voltage offsets; and
      perform the second read operation based on the one or more second read voltage offsets.

24. The memory device of claim 23, wherein a combination of read voltage offsets of the one or more first read voltage offsets, and a combination of read voltage offsets of the one or more second read voltage offsets, are different combinations of read voltage offsets.

25. The memory device of claim 23, wherein the first word line includes a boundary word line; and
   wherein the second word line includes a non-boundary word line.

26. The memory device of claim 25, wherein the controller is configured to:
   determine the one or more first read voltage offsets based on a boundary word line look-up table.

27. The memory device of claim 26, wherein the controller is configured to:
   determine the one or more second read voltage offsets based on a non-boundary word line look-up table.

28. The memory device of claim 25, wherein magnitudes of the one or more first read voltage offsets are greater relative to magnitudes of the one or more second read voltage offsets.

* * * * *